United States Patent
Park et al.

(10) Patent No.: US 11,469,298 B2
(45) Date of Patent: Oct. 11, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Juhun Park, Seoul (KR); Deokhan Bae, Suwon-si (KR); Sungmin Kim, Hwaseong-si (KR); Yuri Lee, Yongin-si (KR); Yoonyoung Jung, Suwon-si (KR); Sooyeon Hong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 17/101,703

(22) Filed: Nov. 23, 2020

(65) Prior Publication Data

US 2021/0384295 A1 Dec. 9, 2021

(30) Foreign Application Priority Data

Jun. 4, 2020 (KR) .......................... 10-2020-0067618

(51) Int. Cl.
*H01L 29/06* (2006.01)
*H03K 19/0185* (2006.01)
*H01L 27/092* (2006.01)

(52) U.S. Cl.
CPC ........ *H01L 29/0653* (2013.01); *H01L 27/092* (2013.01); *H03K 19/018521* (2013.01)

(58) Field of Classification Search
CPC combination set(s) only.
See application file for complete search history.

(56) References Cited

U.S. PATENT DOCUMENTS

| | | | |
|---|---|---|---|
| 9,564,506 B2 | 2/2017 | Leobandung | |
| 9,985,107 B2 | 5/2018 | Cheng et al. | |
| 10,312,332 B2 | 6/2019 | Liaw | |
| 2016/0284697 A1* | 9/2016 | Yoon | H01L 27/088 |
| 2016/0284700 A1* | 9/2016 | Yoon | H01L 29/785 |
| 2019/0363085 A1 | 11/2019 | Oh et al. | |
| 2019/0371673 A1 | 12/2019 | Ching et al. | |
| 2020/0006160 A1 | 1/2020 | Lin et al. | |
| 2020/0020584 A1 | 1/2020 | Lin et al. | |
| 2020/0075421 A1* | 3/2020 | Wu | H01L 21/76801 |

\* cited by examiner

*Primary Examiner* — Mark W Tornow
*Assistant Examiner* — Priya M Rampersaud
(74) *Attorney, Agent, or Firm* — Volentine, Whitt & Francos, PLLC

(57) ABSTRACT

A semiconductor device includes a substrate having PMOSFET and NMOSFET regions spaced apart from each other in a direction, a device isolation layer provided on the substrate that defines first and second active patterns respectively on the PMOSFET and NMOSFET regions, a gate electrode crossing the first and second active patterns, first and second source/drain patterns respectively provided on the first and second active patterns respectively and near the gate electrode, and an active contact extending in the direction and coupled to the first and second source/drain patterns. The active contact includes first and second body portions, which are respectively provided on the first and the second source/drain patterns, and a first protruding portion and a recessed portion, which are provided between the first and second body portions and on the device isolation layer between the PMOSFET and NMOSFET regions. The recessed portion has an upwardly recessed bottom.

20 Claims, 41 Drawing Sheets

SEMICONDUCTOR DEVICE AND METHOD OF FABRICATING THE SAME

CROSS-REFERENCE TO RELATED APPLICATIONS

A claim of priority under 35 U.S.C. § 119 is made to Korean Patent Application No. 10-2020-0067618, filed on Jun. 4, 2020, in the Korean Intellectual Property Office, the entirety of which is hereby incorporated by reference.

BACKGROUND OF THE INVENTION

The present disclosure relates to semiconductor devices and a method of fabricating the same, and more particularly to semiconductor devices including a field effect transistor and a method of fabricating the same.

Due to their small-size, multi-functionality, and/or low-cost characteristics, semiconductor devices have become important elements in the electronic industry. Semiconductor devices may generally be classified as semiconductor memory devices for storing data, semiconductor logic devices for processing data, and hybrid semiconductor devices including both of memory and logic elements. As the electronic industry continues to advance, there has been an increasing demand for semiconductor devices with improved characteristics such as high reliability, high performance, and/or multiple functionality. To meet this demand, the complexity and/or integration density of semiconductor devices have increased.

SUMMARY

Embodiments of the inventive concepts provide a semiconductor device including field effect transistors with improved electric characteristics, and a method of fabricating the same.

Embodiments of the inventive concepts provide a semiconductor device including a substrate having a PMOSFET region and an NMOSFET region spaced apart from each other in a first direction; a device isolation layer on the substrate, the device isolation layer defines a first active pattern on the PMOSFET region and a second active pattern on the NMOSFET region; a gate electrode extending in the first direction and crossing the first and second active patterns; a first source/drain pattern and a second source/drain pattern respectively on the first and second active patterns, each of the first and second source/drain patterns being adjacent to a side of the gate electrode; and a first active contact extending in the first direction and coupled to the first and second source/drain patterns. The first active contact may include a first body portion on the first source/drain pattern, a second body portion on the second source/drain pattern, and a first protruding portion and a recessed portion between the first and second body portions. The first protruding portion and the recessed portion over the device isolation layer between the PMOSFET and NMOSFET regions, and the recessed portion of the first active contact has a bottom surface that is recessed in a second direction away from the device isolation layer.

Embodiments of the inventive concepts further provide a semiconductor device including a first logic cell and a second logic cell on a substrate and adjacent to each other in a first direction, and each of the first and second logic cells may have a first active region and a second active region, the first active region being one of a PMOSFET region and an NMOSFET region, and the second active region being another one of the PMOSFET region and the NMOSFET region; and an active contact extending from the first active region of the first logic cell to the first active region of the second logic cell. The active contact may include a first body portion on the first active region of the first logic cell, a second body portion on the first active region of the second logic cell, and a first protruding portion and a recessed portion between the first and second body portions. The first protruding portion and the recessed portion are over a device isolation layer between the first active region of the first logic cell and the first active region of the second logic cell. A bottom surface of the recessed portion may be higher than a bottom surface of the first protruding portion and may be lower than a bottom surface of the first body portion.

Embodiments of the inventive concepts still further provide a semiconductor device including a logic cell on a substrate, the logic cell having a PMOSFET region and an NMOSFET region separated from each other in a first direction, the logic cell having first to fourth borders, the first border and the second border being opposite to each other in a second direction crossing the first direction, the third border and the fourth border being opposite to each other in the first direction; a device isolation layer on the substrate, the device isolation layer defining a first active pattern on the PMOSFET region and a second active pattern on the NMOSFET region, the first and second active patterns extending in the second direction, upper portions of the first and second active patterns protruding above the device isolation layer; a gate electrode extending in the first direction and crossing the first and second active patterns; a first source/drain pattern and a second source/drain pattern respectively in the upper portions of the first and second active patterns, and each of the first and second source/drain patterns is adjacent to a side of the gate electrode; a separation structure on at least one of the first and second borders; a gate spacer on at least one side surface of the gate electrode; a gate capping pattern on a top surface of the gate electrode; an interlayer insulating layer on the gate capping pattern; an active contact that penetrates the interlayer insulating layer and is coupled to the first and second source/drain patterns; a silicide pattern interposed between the active contact and each of the first and second source/drain patterns; a gate contact that penetrates the interlayer insulating layer and the gate capping pattern and is coupled to the gate electrode; a first metal layer on the interlayer insulating layer, the first metal layer including first and second power lines respectively on the third and fourth borders and extending in the second direction, and first interconnection lines between the first and second power lines, the first interconnection lines being respectively and electrically connected to the active contact and the gate contact; and a second metal layer over the first metal layer. The second metal layer may include second interconnection lines extending in the first direction and electrically connected to the first metal layer. The active contact may include a first body portion on the first source/drain pattern, a second body portion on the second source/drain pattern, and a first protruding portion and a recessed portion between the first and second body portions. The first protruding portion and the recessed portion are on the device isolation layer between the PMOSFET and NMOSFET regions, and the recessed portion of the active contact has a bottom surface recessed in a direction away from the device isolation layer.

Embodiments of the inventive concepts also provide a method of fabricating a semiconductor device include forming a first active pattern and a second active pattern respectively on a PMOSFET region and an NMOSFET region of a substrate; forming a device isolation layer on the substrate that exposes upper portions of the first and second active patterns, forming a first source/drain pattern and a second source/drain pattern respectively in the upper portion of the first active pattern and the upper portion of the second active pattern; forming a gate electrode that crosses the first and second active patterns and extends in a first direction; forming an insulating layer on the gate electrode; forming a hard mask pattern on the insulating layer, the hard mask pattern having an opening vertically overlapping with the first and second source/drain patterns; etching the insulating layer using the hard mask pattern as an etch mask to expose the first and second source/drain patterns; and forming an active contact on the exposed first and second source/drain patterns. The insulating layer exposed by the opening may have a first top surface located at a first level and a second top surface located at a second level higher than the first level. The first top surface may be located over each of the first and second source/drain patterns, and the second top surface may be located over the device isolation layer between the PMOSFET and NMOSFET regions.

Embodiments of the inventive concepts also provide a semiconductor device including a first source/drain pattern on a first active pattern of a substrate; a second source/drain pattern on a second active pattern of the substrate, the first source/drain pattern spaced apart from the second source/drain pattern in a first direction that extends parallel to an upper surface of the substrate; and an active contact extending in the first direction and in contact with a top surface of the first source/drain pattern and a top surface of the second source/drain pattern. The active contact including a first protruding portion extending on an inclined surface of the first source/drain pattern that faces the second source/drain pattern, a second protruding portion extending on an inclined surface of the second source/drain pattern that faces the first source/drain pattern, and a recessed portion between the first and second protruding portions. A bottom surface of the recessed portion is higher than bottom surfaces of the first and second protruding portions along a second direction, and the bottom surface of the recessed portion is lower than the top surfaces of the first and second drain/source patterns along the second direction, wherein the second direction extends orthogonally to the upper surface of the substrate.

DETAILED DESCRIPTION

Figure 1:
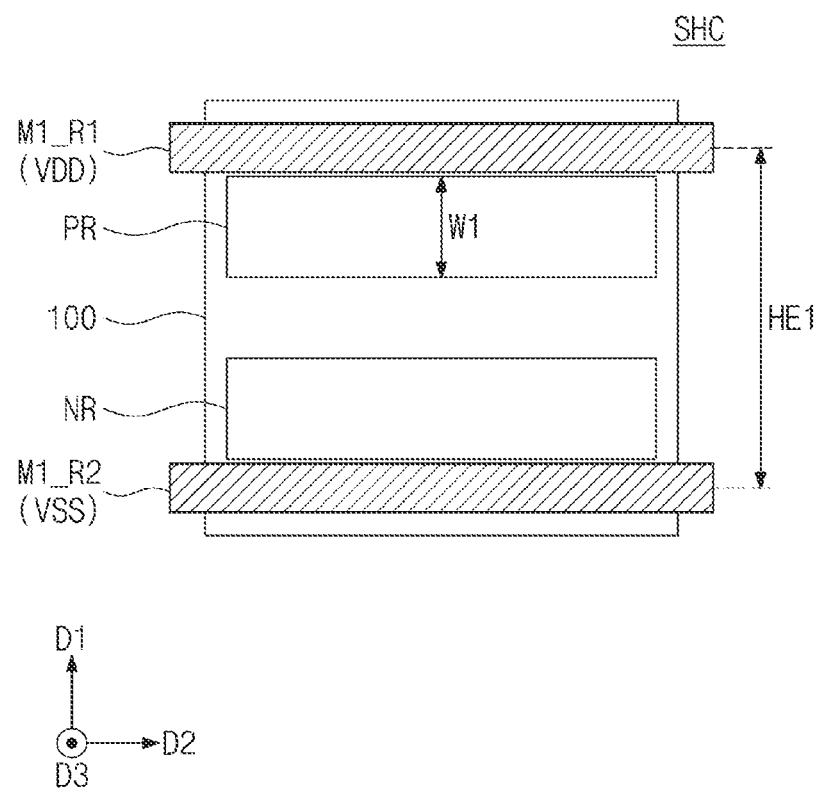
FIG. 1 illustrates a conceptual diagram of logic cells of a semiconductor device according to embodiments of the inventive concepts.
Figure 2:
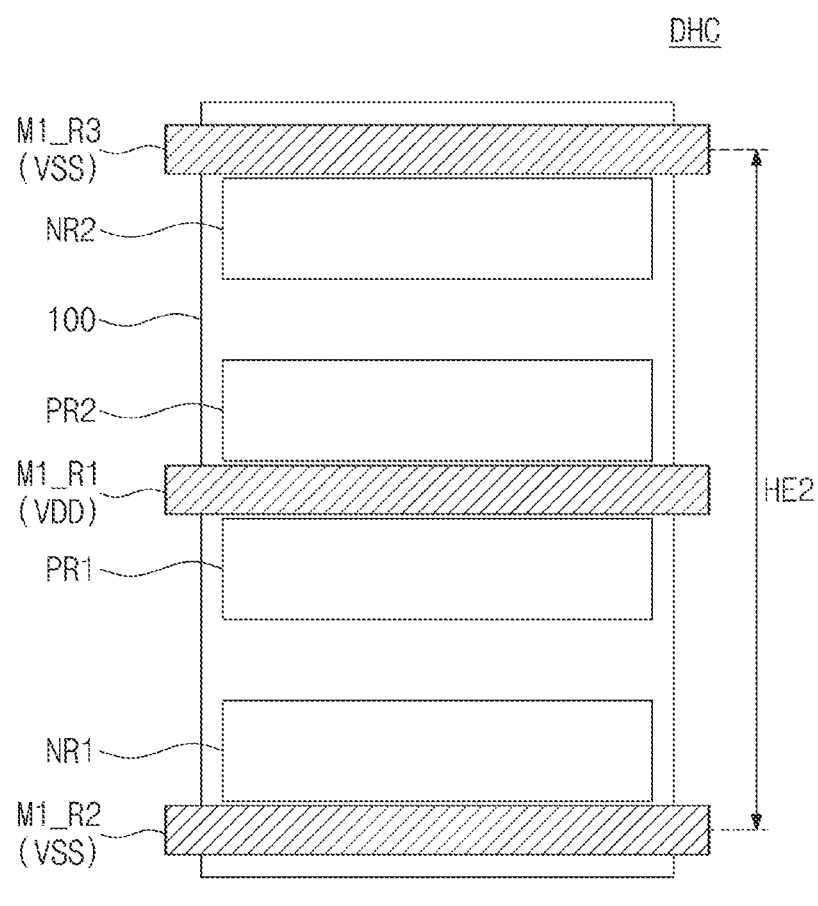
FIG. 2 illustrates a conceptual diagram of logic cells of a semiconductor device according to embodiments of the inventive concepts.
Figure 2:
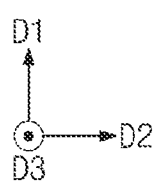
Figure 3:
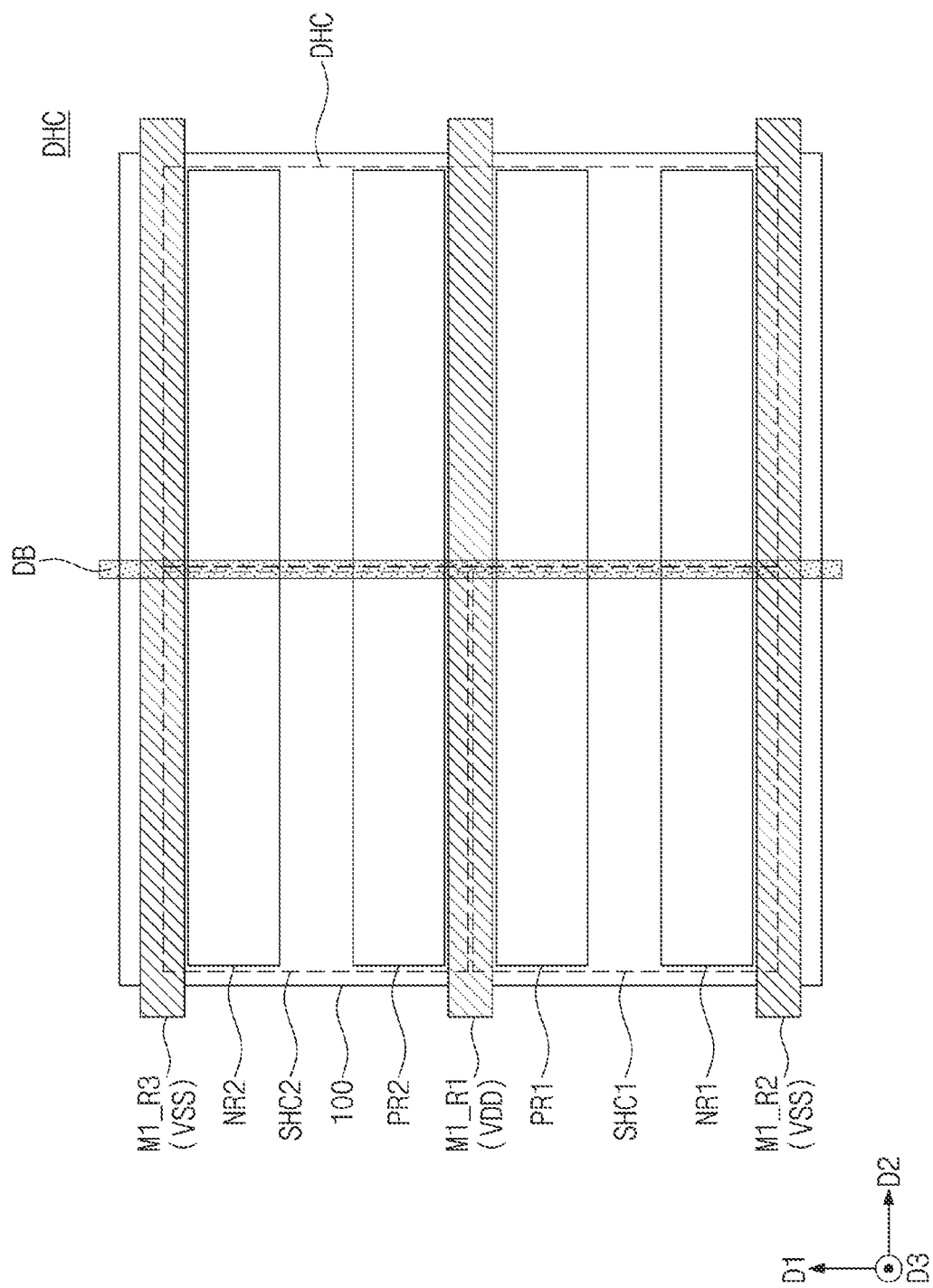
FIG. 3 illustrates a conceptual diagram of logic cells of a semiconductor device according to embodiments of the inventive concepts.

FIGS. 1 to 3 illustrate conceptual diagrams of logic cells of a semiconductor device according to embodiments of the inventive concepts.

Referring to FIG. 1, a single height cell SHC is shown. In detail, a first power line M1_R1 and a second power line M1_R2 may be provided on a substrate 100. The first power line M1_R1 may be a pathway, to which a drain voltage VDD (e.g., a power voltage) is provided. The second power line M1_R2 may be a pathway, to which a source voltage VSS (e.g., a ground voltage) is provided.

The single height cell SHC may be defined between the first power line M1_R1 and the second power line M1_R2. The single height cell SHC may include one PMOSFET region PR and one NMOSFET region NR. In other words, the single height cell SHC may have a CMOS structure provided between the first power line M1_R1 and the second power line M1_R2.

Each of the PMOSFET and NMOSFET regions PR and NR may have a first width W1 in a first direction DE A length of the single height cell SHC in the first direction D1 may be defined as a first height HE1. The first height HE1 may be substantially equal to a distance (e.g., pitch) between the first power line M1_R1 and the second power line M1_R2.

The single height cell SHC may constitute a single logic cell. It should be understood that herein a logic cell may mean a logic device (e.g., AND, OR, XOR, XNOR, inverter, and so forth), which is configured to execute a specific function. In other words, the logic cell may include transistors and interconnection lines, which are connected to each other to constitute the logic device.

Referring to FIG. 2, a double height cell DHC is shown. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a pathway, to which the drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to function as a single PMOSFET region.

Thus, a channel size of the PMOS transistor of the double height cell DHC may be larger than a channel size of the PMOS transistor of the single height cell SHC of FIG. 1. For example, the channel size of the PMOS transistor of the double height cell DHC may be about two times the channel size of the PMOS transistor of the single height cell SHC. In this case, the double height cell DHC may be operated at a higher speed that the single height cell SHC. In an embodiment, the double height cell DHC shown in FIG. 2 may be defined as a multi-height cell. Although not shown, the multi-height cell may include a triple height cell whose height is about three times that of the single height cell SHC.

Referring to FIG. 3, a first single height cell SHC1, a second single height cell SHC2, and the double height cell DHC are shown as two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A separation structure DB may be provided between the first single height cell SHC1 and the double height cell DHC, and between the second single height cell SHC2 and the double height cell DHC. The active region of the double height cell DHC may be electrically separated from the active region of each of the first and second single height cells SHC1 and SHC2 by the separation structure DB.

Figure 4:
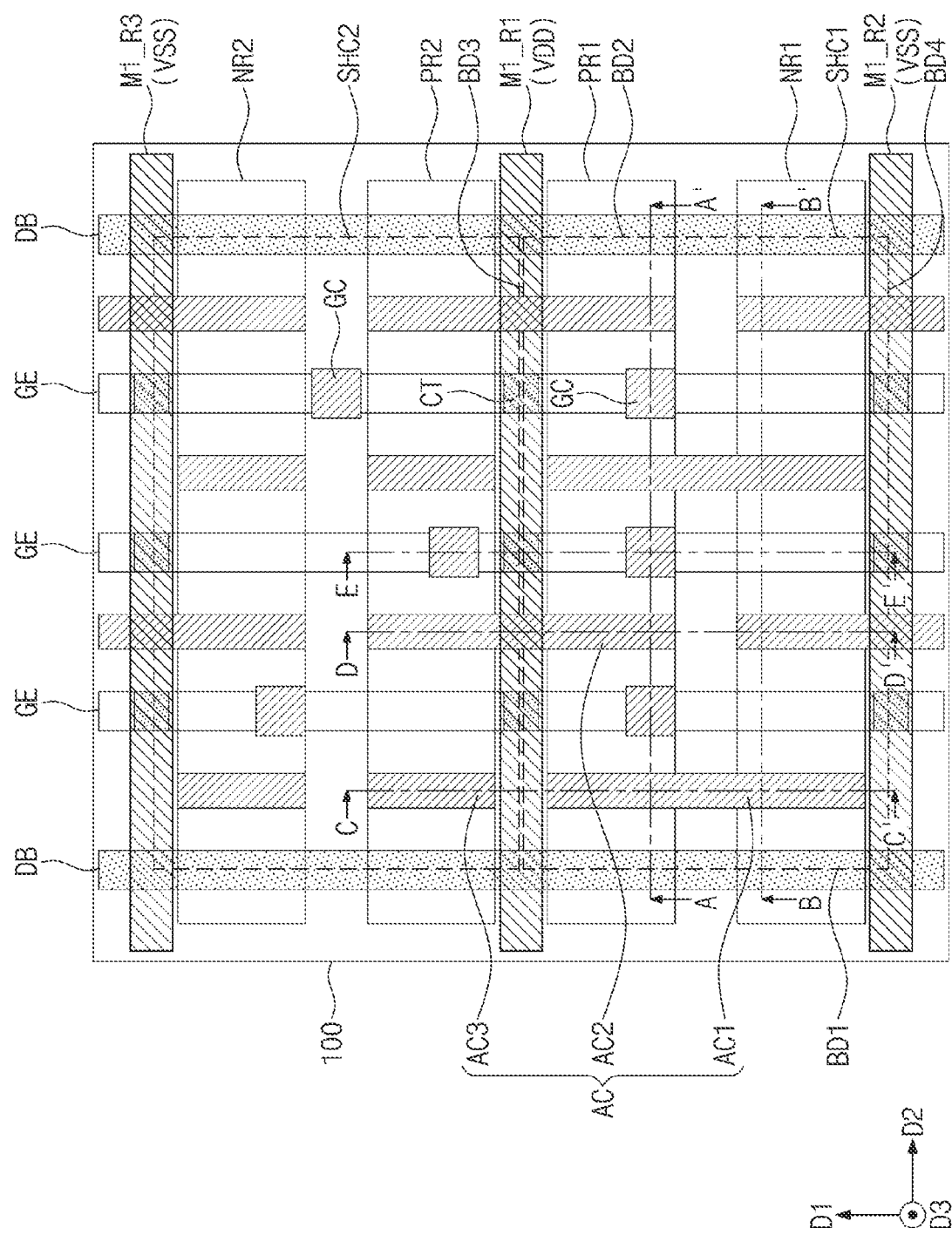
FIG. 4 illustrates a plan view of a semiconductor device according to embodiments of the inventive concepts.

FIG. 4 illustrates a plan view of a semiconductor device according to embodiments of the inventive concepts. FIGS. 5A to 5E illustrate sectional views respectively taken along lines A-A', B-B', C-C', D-D', and E-E of FIG. 4. FIGS. 4 and 5A to 5E illustrate an example of a detailed structure of the first and second single height cells SHC1 and SHC2 of FIG. 3.

Referring to FIGS. 4 and 5A to 5E, the first and second single height cells SHC1 and SHC2 may be provided on the substrate 100. Logic transistors constituting a logic circuit may be disposed on each of the first and second single height cells SHC1 and SHC2. The substrate 100 may be a semiconductor substrate including for example silicon, germanium, silicon-germanium, or the like, or a compound semiconductor substrate. As an example, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may extend in (or along) the second direction D2 as shown in FIG. 4 for example.

The first PMOSFET region PR1, the second PMOSFET region PR2, the first NMOSFET region NR1, and the second NMOSFET region NR2 may be defined by a second trench TR2, which is formed in an upper portion of the substrate 100. For example, the second trench TR2 may be located between the first NMOSFET region NR1 and the first PMOSFET region PR1. The second trench TR2 may also be located between the first PMOSFET region PR1 and the second PMOSFET region PR2. The second trench TR2 may be located between the second PMOSFET region PR2 and the second NMOSFET region NR2.

First active patterns API may be provided on each of the first and second PMOSFET regions PR1 and PR2. Second active patterns AP2 may be provided on each of the first and second NMOSFET regions NR1 and NR2.

The first and second active patterns AP1 and AP2 may extend in the second direction D2 to be parallel to each other. The first and second active patterns AP1 and AP2 may be portions (e.g., vertically protruding portions) of the substrate 100. First trenches TR1 may be defined between adjacent ones of the first active patterns AP1, and between adjacent ones of the second active patterns AP2. The first trench TR1 may be shallower than the second trench TR2.

A device isolation layer ST may be provided to fill the first and second trenches TR1 and TR2. The device isolation layer ST may include a silicon oxide layer for example. An upper portion of each of the first and second active patterns AP1 and AP2 may be a protruding pattern, which vertically extends above the device isolation layer ST (e.g., see FIG. 5E). The upper portion of each of the first and second active patterns AP1 and AP2 may have a fin shape. The device isolation layer ST may not cover the upper portion of each of the first and second active patterns AP1 and AP2. The device isolation layer ST may cover a lower side surface of each of the first and second active patterns AP1 and AP2.

First source/drain patterns SD1 may be provided on each of the first and second PMOSFET regions PR1 and PR2. The first source/drain patterns SD1 may be provided in the upper portion of each of the first active patterns AP1. The first source/drain patterns SD1 may be impurity regions of a first conductivity type (e.g., p-type). A first channel pattern CH1 may be interposed between each pair of the first source/drain patterns SD1, which are adjacent to each other in the second direction D2.

Second source/drain patterns SD2 may be provided on each of the first and second NMOSFET regions NR1 and NR2. The second source/drain patterns SD2 may be provided in the upper portion of each of the second active patterns AP2. The second source/drain patterns SD2 may be impurity regions of a second conductivity type (e.g., n-type). A second channel pattern CH2 may be interposed between each pair of the second source/drain patterns SD2, which are adjacent to each other in the second direction D2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain pattern SD1 may include a semiconductor material (e.g., SiGe) having a lattice constant greater than that of the semiconductor substrate 100. In this case, the pair of the first source/drain patterns SD1 may exert a compressive stress on the first channel pattern CH1 therebetween. In an embodiment, the second source/drain pattern SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged at a first pitch in the second direction D2. The gate electrodes GE may overlap with the first and second channel patterns CH1 and CH2, when viewed in a plan view. Each of the gate electrodes GE may be provided to face a top surface and opposite side surfaces of each of the first and second channel patterns CH1 and CH2.

Referring back to FIG. 5E, the gate electrode GE may be provided on a first top surface TS1 of the first channel pattern CH1 and at least one first side surface SW1 of the first channel pattern CH1. The gate electrode GE may also be provided on a second top surface TS2 of the second channel pattern CH2 and at least one second side surface SW2 of the second channel pattern CH2. In other words, the transistors according to the present embodiments may be three-dimensional field-effect transistors (e.g., FinFETs), in which the gate electrode GE is provided to three-dimensionally surround the channel patterns CH1 and CH2.

As an example, the first single height cell SHC1 may have a first border BD1 and a second border BD2, which are opposite to each other in the second direction D2. The first and second borders BD1 and BD2 may extend in the first direction D1. The first single height cell SHC1 may further have a third border BD3 and a fourth border BD4, which are opposite to each other in the first direction D1. The third and fourth borders BD3 and BD4 may extend in the second direction D2.

Gate cutting patterns CT may be disposed on the third and fourth borders BD3 and BD4 of the first single height cell SHC1. The gate cutting patterns CT may be disposed on the border, in the second direction D2, of each of the first and second single height cells SHC1 and SHC2. The gate cutting patterns CT may be arranged at the first pitch along the third border BD3. The gate cutting patterns CT may also be arranged at the first pitch along the fourth border BD4. When viewed in a plan view, the gate cutting patterns CT on the third and fourth borders BD3 and BD4 may be disposed to overlap with the gate electrodes GE, respectively. The gate cutting patterns CT may be formed of or include at least one of insulating materials (e.g., silicon oxide or silicon nitride).

The gate electrode GE on the first single height cell SHC1 may be spaced apart from the gate electrode GE on the second single height cell SHC2 by the gate cutting pattern CT. The gate cutting pattern CT may be interposed between the gate electrodes GE on the first and second single height cells SHC1 and SHC2 which are aligned with each other in the first direction D1. In other words, the gate electrode GE extending in the first direction D1 may be divided into a plurality of the gate electrodes GE by the gate cutting patterns CT.

Referring back to FIGS. 4 and 5A to 5E, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may for example be formed of or include at least one of SiCN, SiCON, or SiN. In an embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may extend along the gate electrode GE and in the first direction D1. The gate capping pattern GP may be formed of or include at least one of materials having an etch selectivity with respect to first and second interlayer insulating layers 110 and 120, which will be described below. In detail, the gate capping pattern GP may for example be formed of or include at least one of SiON, SiCN, SiCON, or SiN.

A gate dielectric pattern GI may be interposed between the gate electrode GE and the first active pattern AP1 and between the gate electrode GE and the second active pattern AP2. The gate dielectric pattern GI may extend along and on a bottom surface of the gate electrode GE. As an example, the gate dielectric pattern GI may cover the first top surface TS1 and the first side surface SW1 of the first channel pattern CH1. The gate dielectric pattern GI may also cover the second top surface TS2 and opposite second side surfaces SW2 of the second channel pattern CH2. The gate dielectric pattern GI may cover the top surface of the device isolation layer ST below the gate electrode GE (e.g., see FIG. 5E).

In an embodiment, the gate dielectric pattern GI may be formed of or include a high-k dielectric material, whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may be formed of or include metal nitride. For example, the first metal pattern may include at least one metal, selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of stacked work-function metal layers.

The second metal pattern may include a metallic material, whose resistance is lower than the first metal pattern. For example, the second metal pattern may include at least one metal selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of separation structures DB may be provided at both sides of each of the first and second single height cells SHC1 and SHC2 to be opposite to each other in the second direction D2. For example, the pair of the separation structures DB may be, respectively, provided on the first and second borders BD1 and BD2 of the first single height cell SHC1. The separation structure DB may extend in the first direction D1 and parallel to the gate electrodes GE. A pitch between the separation structure DB and the gate electrode GE adjacent thereto may be equal to the first pitch.

The separation structure DB may be provided to penetrate the first and second interlayer insulating layers 110 and 120 and may extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of a neighboring cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE. When viewed in a plan view, each of the active contacts AC may be a bar- or line-shaped pattern extending in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Silicide patterns SC may be respectively interposed between the active contacts AC and the first and second source/drain patterns SD1 and SD2. The active contacts AC may be electrically connected to the first and second source/drain patterns SD1 and SD2, respectively, through the silicide patterns SC. The silicide pattern SC may be formed of or include at least one of metal-silicide materials (e.g., titanium silicide, tantalum silicide, tungsten silicide, nickel silicide, and cobalt silicide).

The active contacts AC may include a first active contact AC1, a second active contact AC2, and a third active contact AC3. The first active contact AC1 on the first single height cell SHC1 may electrically connect the first source/drain pattern SD1 of the first PMOSFET region PR1 to the second source/drain pattern SD2 of the first NMOSFET region NR1. The first active contact AC1 may extend from the second source/drain pattern SD2 of the first NMOSFET region NR1 to the first source/drain pattern SD1 of the first PMOSFET region PR1 in the first direction D1.

The second active contact AC2 may electrically connect the first source/drain pattern SD1 of the first PMOSFET region PR1 to the first source/drain pattern SD1 of the second PMOSFET region PR2. The second active contact AC2 may extend from the first source/drain pattern SD1 of the first PMOSFET region PR1 to the first source/drain pattern SD1 of the second PMOSFET region PR2 in the first direction D1. The second active contact AC2 may cross the border (e.g., the third border BD3) between the first and second single height cells SHC1 and SHC2 and may be coupled in common to the first PMOSFET region PR1 of the first single height cell SHC1 and the second PMOSFET region PR2 of the second single height cell SHC2. The second active contact AC2 may be electrically connected to the first power line M1_R1 of a first metal layer M1 through a first via VI1.

The third active contact AC3 on the second single height cell SHC2 may be locally provided on only the first source/drain pattern SD1 of the second PMOSFET region PR2 or the second source/drain pattern SD2 of the second NMOSFET region NR2. Unlike the first and second active contacts AC1 and AC2 described above, the third active contact AC3 may be localized on a single active region and may not connect adjacent ones of the active regions to each other.

When viewed in a plan view, a length of the third active contact AC3 in the first direction D1 may be smaller than a length of each of the first and second active contacts AC1 and AC2 in the first direction D1. For example, the length of the third active contact AC3 may be smaller than half of the length of each of the first and second active contacts AC1 and AC2.

Gate contacts GC, which are electrically and respectively connected to the gate electrodes GE, may be provided to penetrate the second interlayer insulating layer 120 and the gate capping pattern GP. When viewed in a plan view, the gate contacts GC on the first single height cell SHC1 may be disposed to overlap with the first PMOSFET region PR1. In other words, the gate contacts GC on the first single height cell SHC1 may be provided on the first active pattern AP1 (e.g., see FIG. 5A).

Meanwhile, the gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the second trench TR2.

Figure 5A:
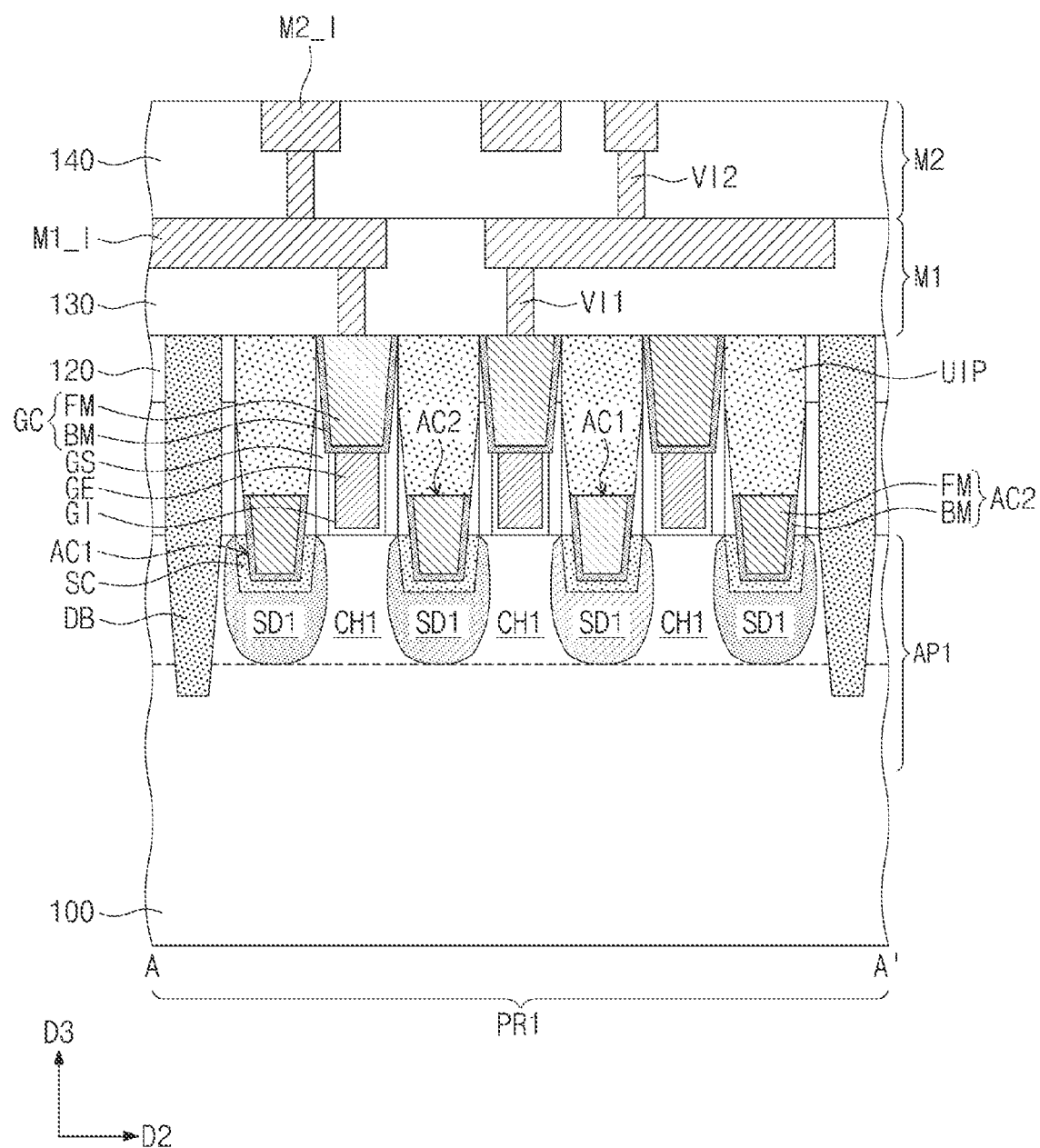
FIGS. 5A, 5B, 5C, 5D and 5E illustrate sectional views respectively taken along lines A-A', B-B', C-C', D-D', and E-E' of FIG. 4.
Figure 5B:
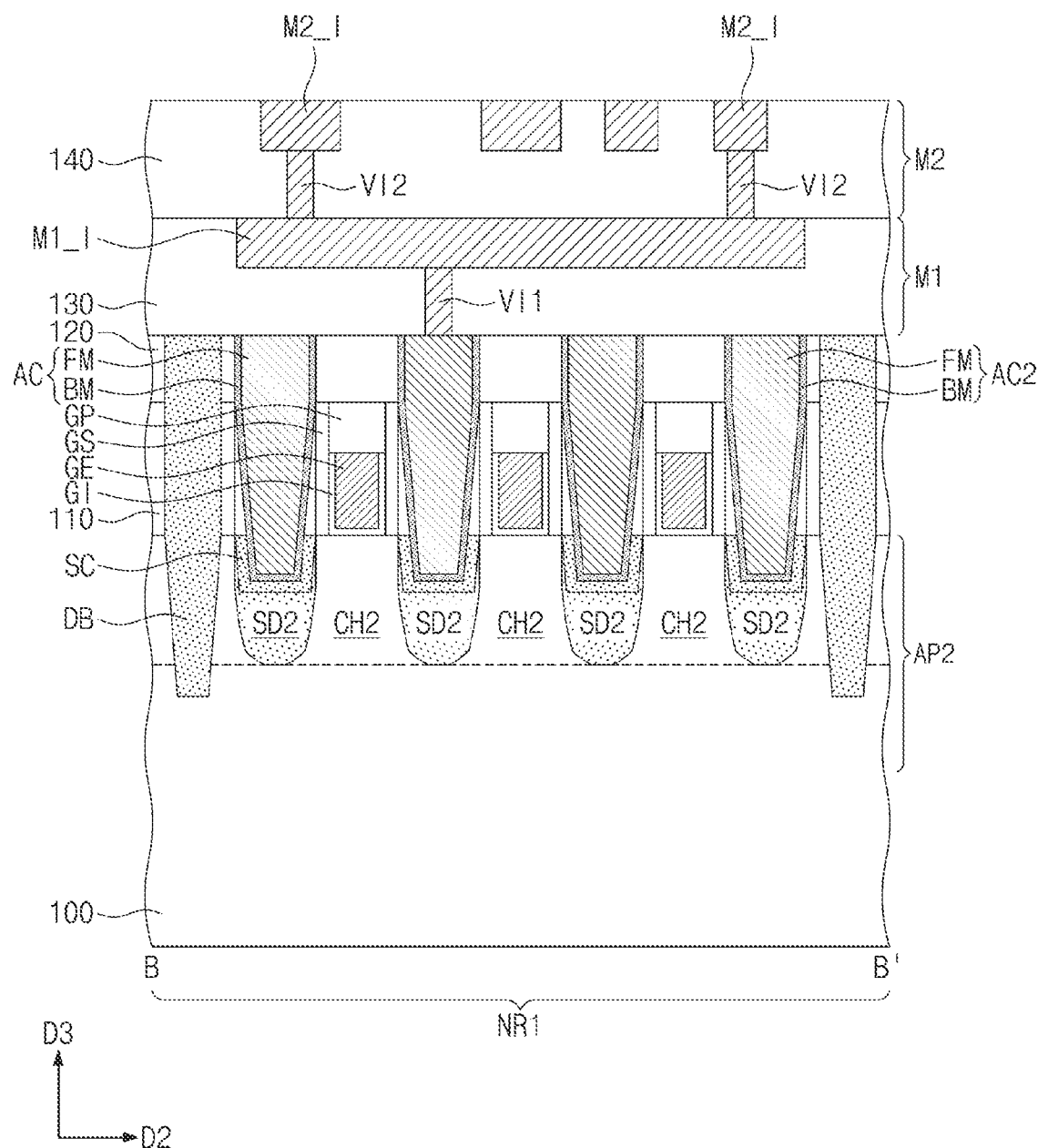
Figure 5C:
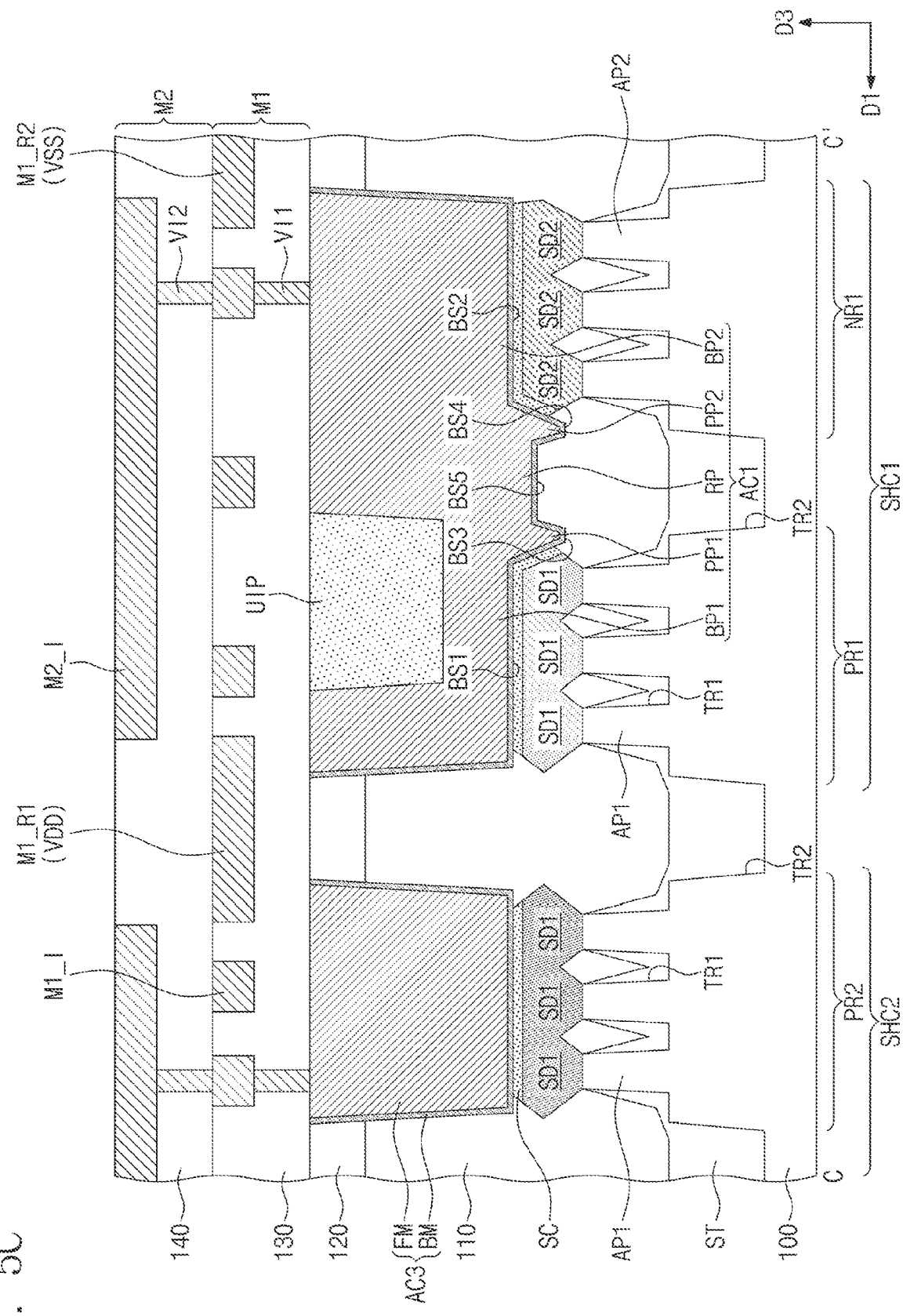
Figure 5D:
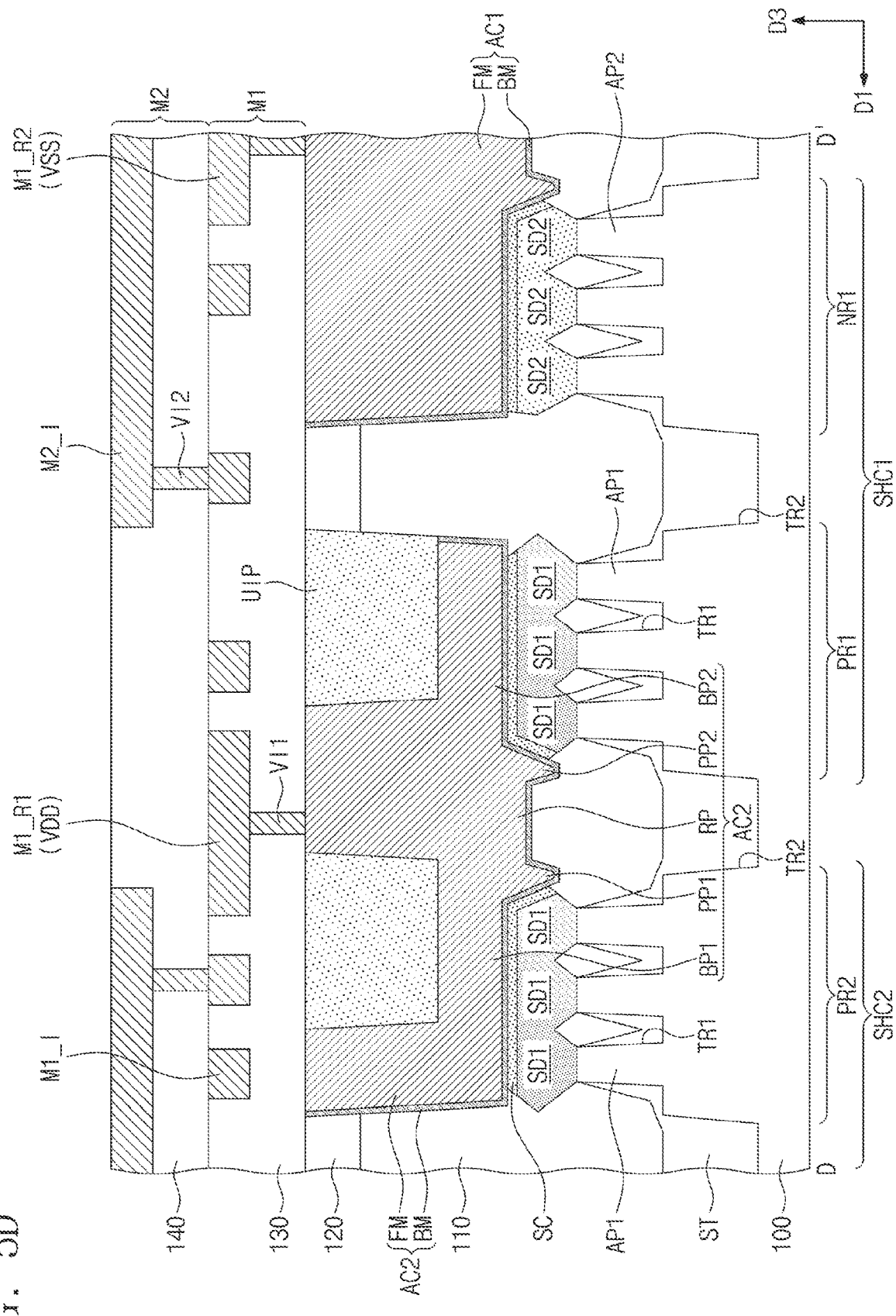
Figure 5E:
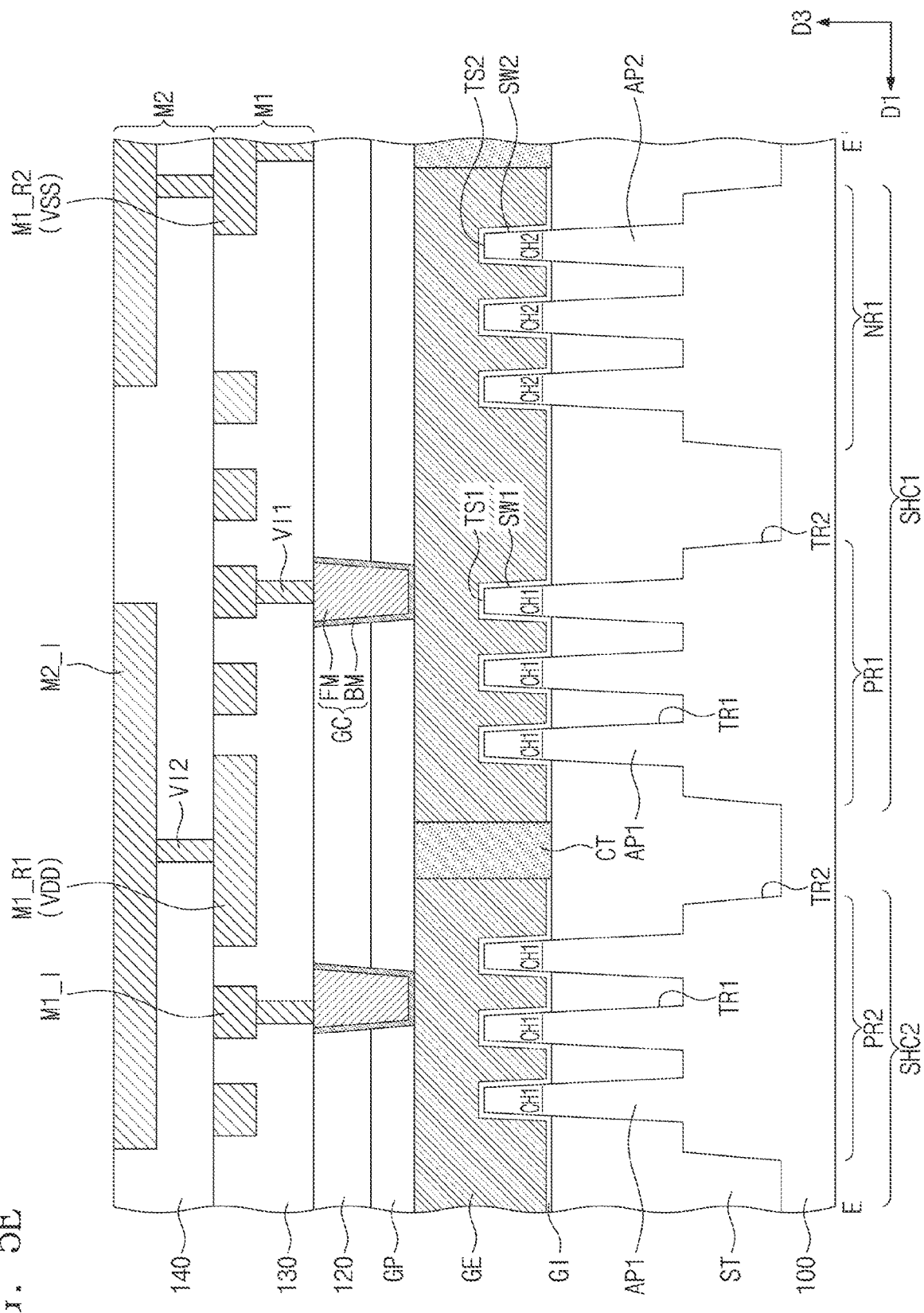

In an embodiment, referring to FIGS. 5A, 5C, and 5D, an upper portion of each of the active contacts AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP (e.g., see FIG. 5A). Accordingly, it may be possible to prevent the gate contact GC and the active contact AC adjacent thereto from being in contact with each other and thereby prevent a short circuit issue from occurring. As in the second active contact AC2 shown in FIG. 5D, two upper insulating patterns UIP may be disposed in the active contact AC elongated in the first direction D1.

Each of the active and gate contacts AC and GC may include a conductive pattern FM and a barrier pattern BM enclosing the conductive pattern FM. The conductive pattern FM may be formed of or include at least one metal of, for example, aluminum, copper, tungsten, molybdenum, or cobalt. The barrier pattern BM may cover side and bottom surfaces of the conductive pattern FM. The barrier pattern BM may include a metal layer and a metal nitride layer. The metal layer may for example be formed of or include at least one of titanium, tantalum, tungsten, nickel, cobalt, or platinum. The metal nitride layer may for example be formed of or include at least one of titanium nitride (TiN), tantalum nitride (TaN), tungsten nitride (WN), nickel nitride (NiN), cobalt nitride (CoN), or platinum nitride (PtN).

The first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and MU of the first metal layer M1 may extend in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may extend along the third border BD3 and in the second direction D2. The second power line M1_R2 may extend along the fourth border BD4 and in the second direction D2.

The first interconnection lines M1_I of the first metal layer M1 may be arranged at a second pitch in the first direction D1. The second pitch may be smaller than the first pitch. A line width of each of the first interconnection lines M1_I may be smaller than a line width of each of the first to third power lines M1_R1, M1_R2, and M1_R3.

The first metal layer M1 may further include the first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, each of the interconnection line of the first metal layer M1 and the first via VI1 may be formed by a single damascene process. The semiconductor device according to the present embodiment may be fabricated by a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. In other words, the second interconnection lines M2_I may extend in the first direction D1 to be parallel to each other.

The second metal layer M2 may further include second vias VI2, which are respectively provided below the second interconnection lines M2_I. The interconnection line of the first metal layer M1 and the interconnection line of the second metal layer M2 may be electrically connected to each other through the second via VI2. The interconnection line of the second metal layer M2 and the second via VI2 thereunder may be formed together by a dual damascene process.

The interconnection line of the first metal layer M1 and the interconnection line of the second metal layer M2 may be formed of or include the same conductive material or different conductive materials. For example, the interconnection line of the first metal layer M1 and the interconnection line of the second metal layer M2 may be formed of or include at least one metal material, selected from aluminum, copper, tungsten, molybdenum, and cobalt. Although not shown, a plurality of metal layers (e.g., M3, M4, M5, . . . , Mn) may be additionally stacked on the fourth interlayer insulating layer 140. Each of the stacked metal layers may include interconnection lines for routing between cells.

The first active contact AC1 will be described in more detail with reference to FIG. 5C. The first active contact AC1 may include a first body portion BP1 on the first source/drain pattern SD1 and a second body portion BP2 on the second source/drain pattern SD2. The first body portion BP1 may be connected to a top surface of the first source/drain pattern SD1 through the silicide pattern SC, and the second body portion BP2 may be connected to a top surface of the second source/drain pattern SD2 through the silicide pattern SC.

The first active contact AC1 may further include at least one protruding portion PP1 or PP2 and at least one recessed portion RP, which are interposed between the first and second body portions BP1 and BP2. For example, the first active contact AC1 may include a first protruding portion PP1, a second protruding portion PP2, and a recessed portion RP therebetween. The first protruding portion PP1, the second protruding portion PP2, and the recessed portion RP may be provided on (or over) the device isolation layer ST and between the first PMOSFET region PR1 and the first NMOSFET region NR1.

The first protruding portion PP1 may extend from the first body portion BP1 toward the device isolation layer ST along an inclined side surface of the first source/drain pattern SD1. The second protruding portion PP2 may extend from the second body portion BP2 toward the device isolation layer ST along an inclined side surface of the second source/drain pattern SD2. The recessed portion RP may be a portion of the first active contact AC1 whose bottom is recessed in a direction away from the device isolation layer ST.

A bottom surface BS3 of the first protruding portion PP1 may be lower than a bottom surface BS1 of the first body portion BP1. The bottom surface BS3 of the first protruding portion PP1 may be located at a level higher than the device isolation layer ST. For example, the first protruding portion PP1 may be vertically spaced apart from the device isolation layer ST with the first interlayer insulating layer 110 interposed therebetween.

A bottom surface BS4 of the second protruding portion PP2 may be lower than a bottom surface BS2 of the second body portion BP2. The bottom surface BS4 of the second protruding portion PP2 may be located at a level higher than the device isolation layer ST. For example, the second protruding portion PP2 may be vertically spaced apart from the device isolation layer ST with the first interlayer insulating layer 110 interposed therebetween.

A bottom surface BS5 of the recessed portion RP may be higher than the bottom surface BS3 of the first protruding portion PP1 and may be higher than the bottom surface BS4 of the second protruding portion PP2. The bottom surface BS5 of the recessed portion RP may be lower than the bottom surface BS1 of the first body portion BP1 and may be lower than the bottom surface BS2 of the second body portion BP2.

The first active contact AC1 may be connected to the top surface of the first source/drain pattern SD1 through the first body portion BP1 and may be also be connected to the inclined side surface of the first source/drain pattern SD1 through the first protruding portion PP1. In other words, due to the first protruding portion PP1, it may be possible to increase a contact area between the first active contact AC1 and the first source/drain pattern SD1. Thus, an electric resistance between the first active contact AC1 and the first source/drain pattern SD1 may be lowered. Similarly, due to the second protruding portion PP2, it may be possible to increase a contact area between the first active contact AC1 and the second source/drain pattern SD2. Thus, an electric resistance between the first active contact AC1 and the second source/drain pattern SD2 may be lowered. As a result, it may be possible to improve an operation property (e.g., an operation speed) of the semiconductor device according to embodiments of the inventive concepts.

Figure 6:
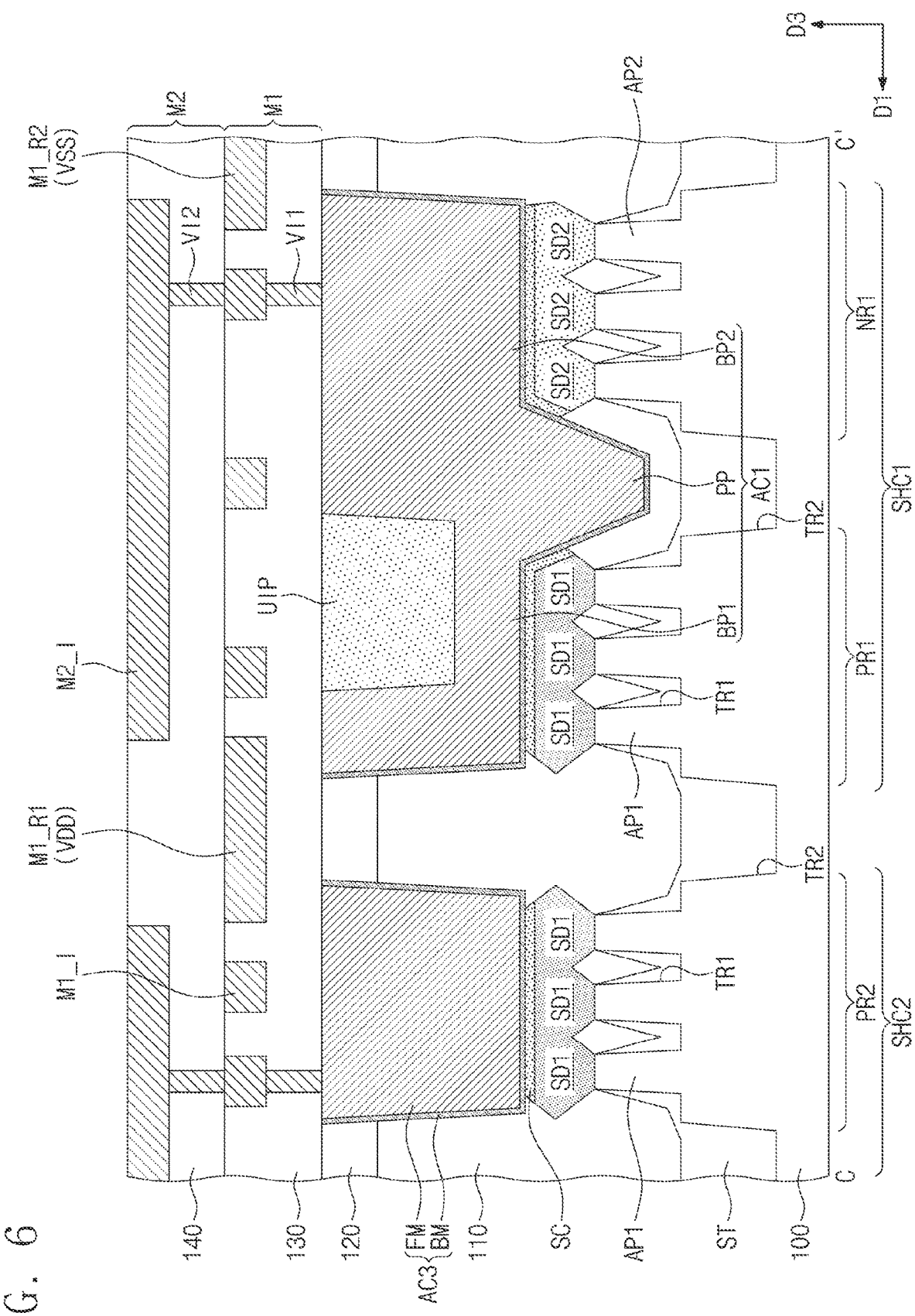
FIG. 6 illustrates a sectional view taken along the line C-C' of FIG. 4 of a semiconductor device according to a comparative example.
Figure 7:
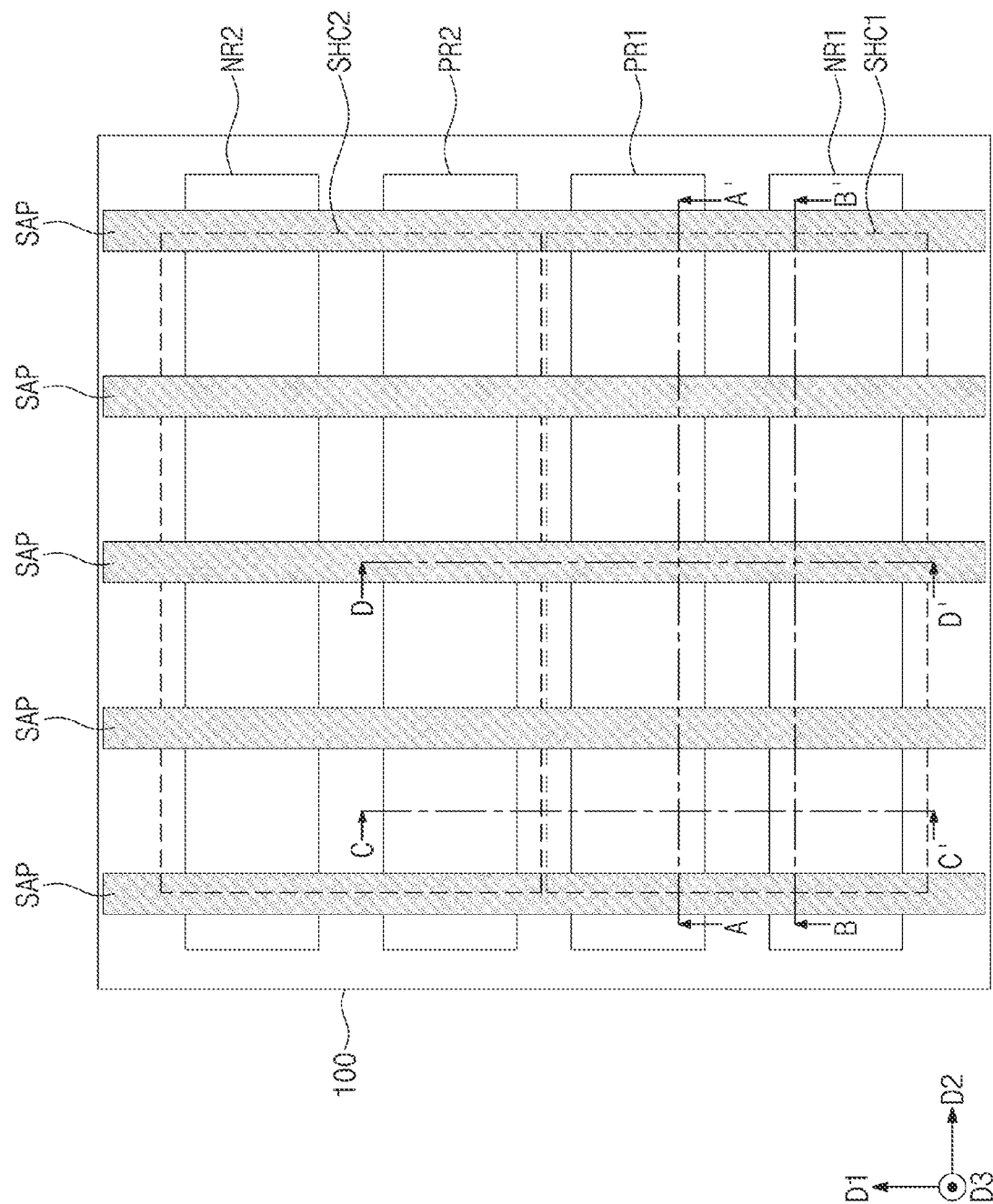
FIG. 7 illustrates a plan view descriptive of a method of fabricating a semiconductor device according to embodiments of the inventive concepts.

FIG. 6 illustrates a sectional view taken along the line C-C' of FIG. 4 of a semiconductor device according to a comparative example. Referring to FIG. 6, the first active contact AC1 of FIG. 6 may include only one protruding portion PP between the first and second body portions BP1 and BP2, unlike the first active contact AC1 of FIG. 5C. For example, the first active contact AC1 may not include the recessed portion RP.

The protruding portion PP of the first active contact AC1 may extend to a level that is very close to the device isolation layer ST. In the case where the protruding portion PP is deeply extended in a downward direction, a parasitic capacitance between the first source/drain pattern SD1 and the protruding portion PP may be increased. Similarly, a parasitic capacitance between the second source/drain pattern SD2 and the protruding portion PP may be also increased. Thus, if the protruding portion PP of the first active contact AC1 is deeply extended in the downward direction, it is possible to reduce a resistance, as described above, but an operation property of the device may be deteriorated by the increase of the parasitic capacitance.

However, in the semiconductor device of FIG. 5C according to embodiments of the inventive concepts, since the first active contact AC1 includes the recessed portion RP, the parasitic capacitance between the first source/drain pattern SD1 and the first active contact AC1 may be reduced. Similarly, the parasitic capacitance between the second source/drain pattern SD2 and the first active contact AC1 may be also reduced. That is, according to embodiments of the inventive concepts, it may be possible to reduce both of the electric resistance and the parasitic capacitance between the contact and the source/drain pattern. That is, it may be possible to improve an operation property and an operation speed of the semiconductor device.

As shown in FIG. 5D, the second active contact AC2 may have substantially the same bottom profile as the first active contact AC1 previously described with reference to FIG. 5C. The second active contact AC2 may include the first body portion BP1 on the first source/drain pattern SD1 of the second PMOSFET region PR2 and the second body portion BP2 on the first source/drain pattern SD1 of the first PMOSFET region PR1. The second active contact AC2 may further include the first and second protruding portions PP1 and PP2, which are interposed between the first and second body portions BP1 and BP2, and the recessed portion RP provided therebetween.

Due to the first and second protruding portions PP1 and PP2, a contact resistance between the second active contact AC2 and the first source/drain pattern SD1 may be reduced. Due to the recessed portion RP, a parasitic capacitance between the second active contact AC2 and the first source/drain pattern SD1 may be reduced. As a result, it may be possible to improve an operation property and an operation speed of the device.

Figure 8A:
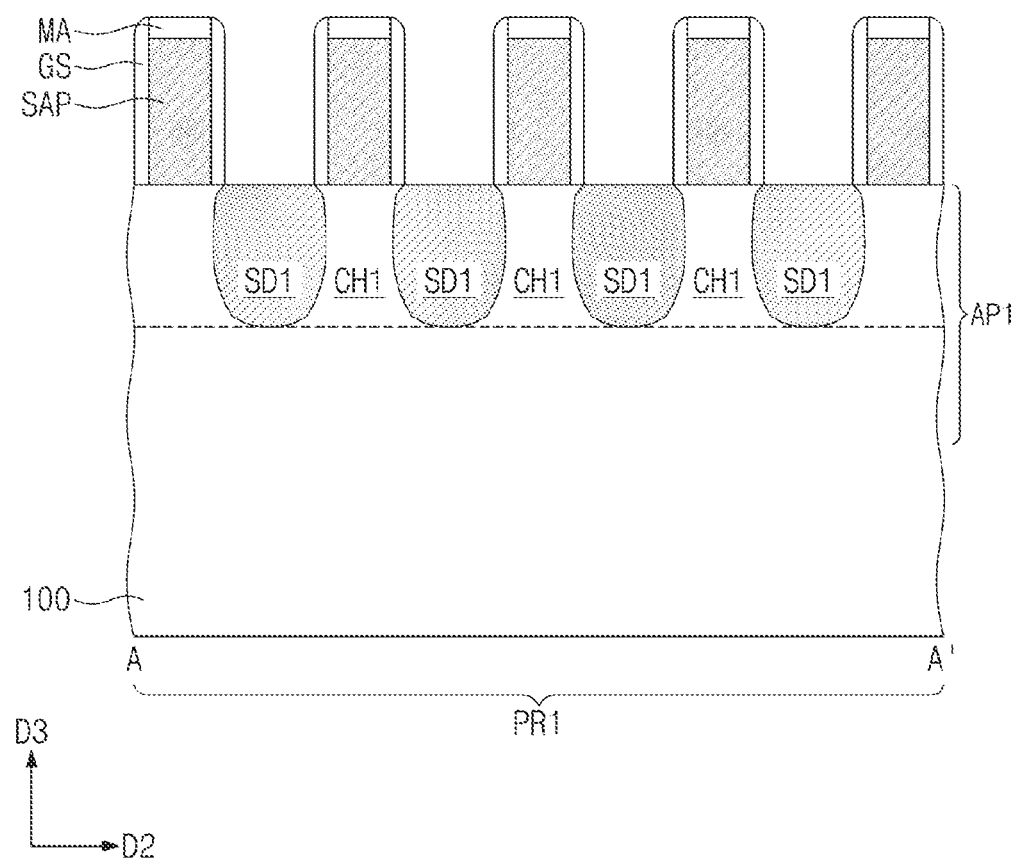
FIGS. 8A, 8B, 8C and 8D illustrate sectional views respectively taken along lines A-A', B-B', C-C' and D-D' of FIG. 7.
Figure 8B:
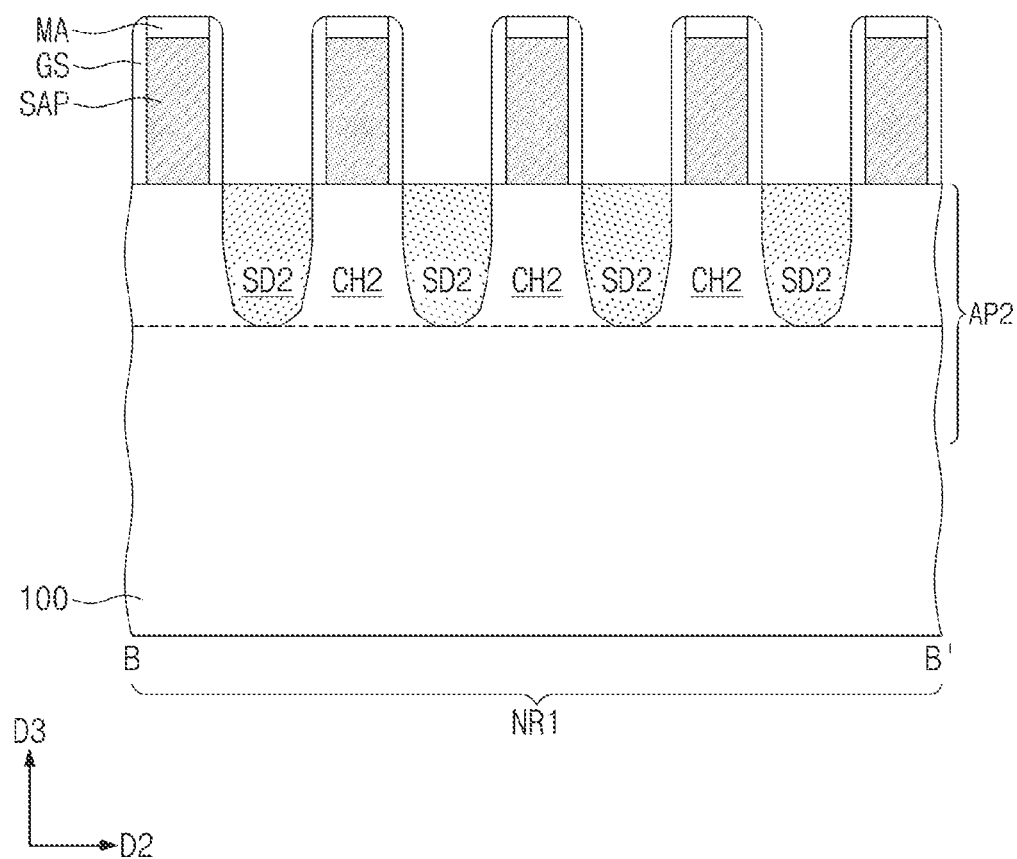
Figure 8C:
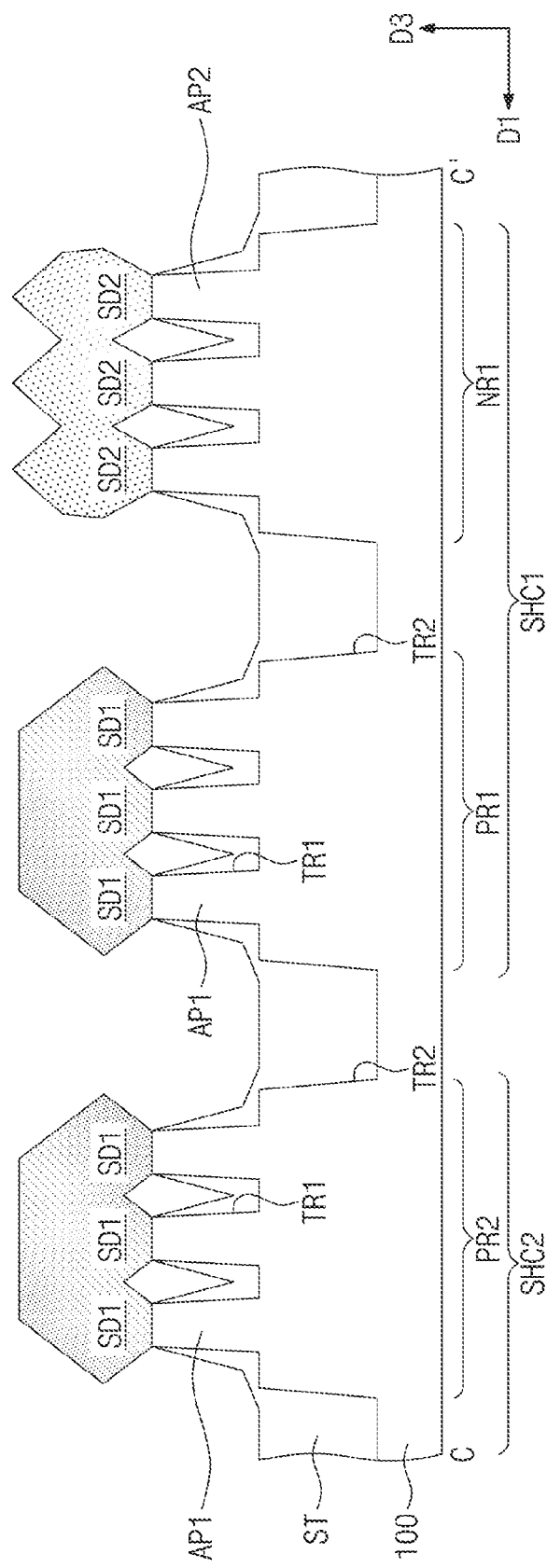
Figure 8D:
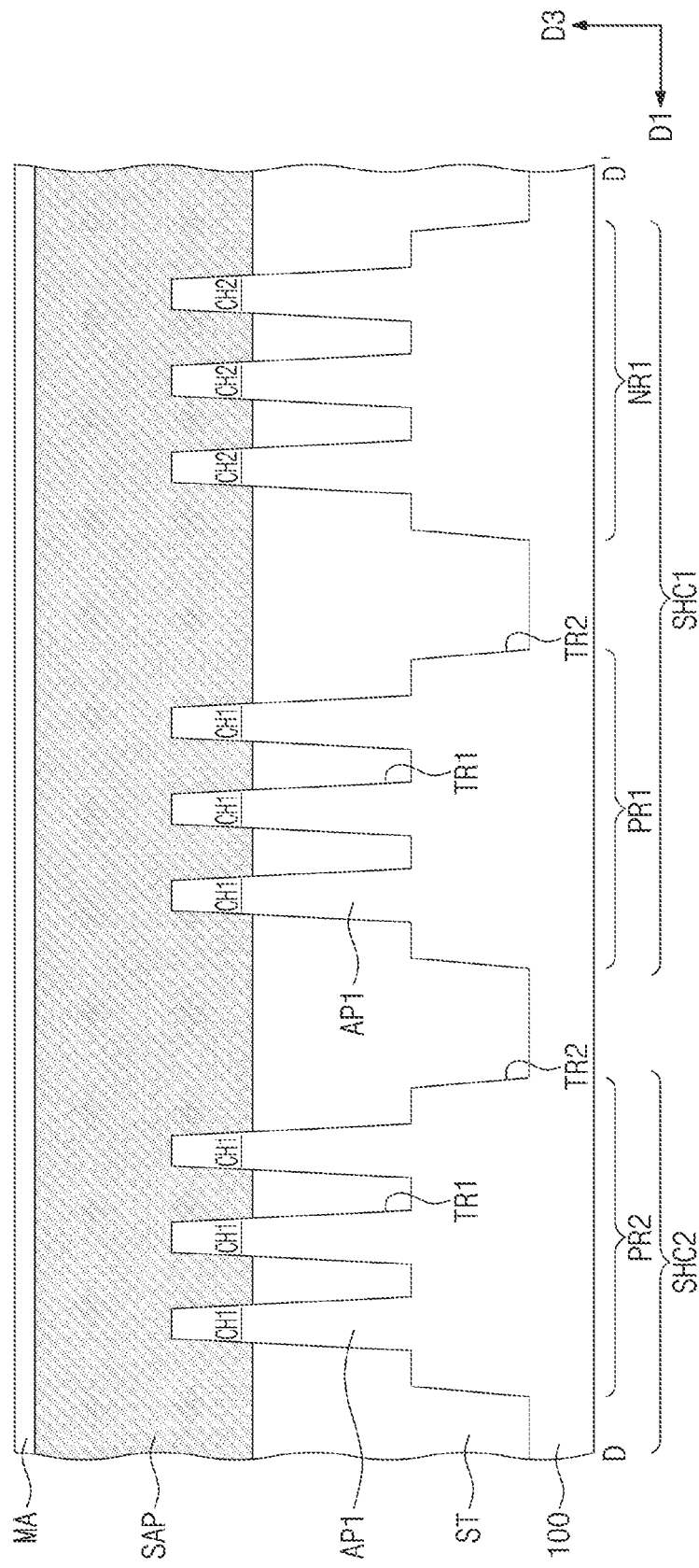
Figure 9:
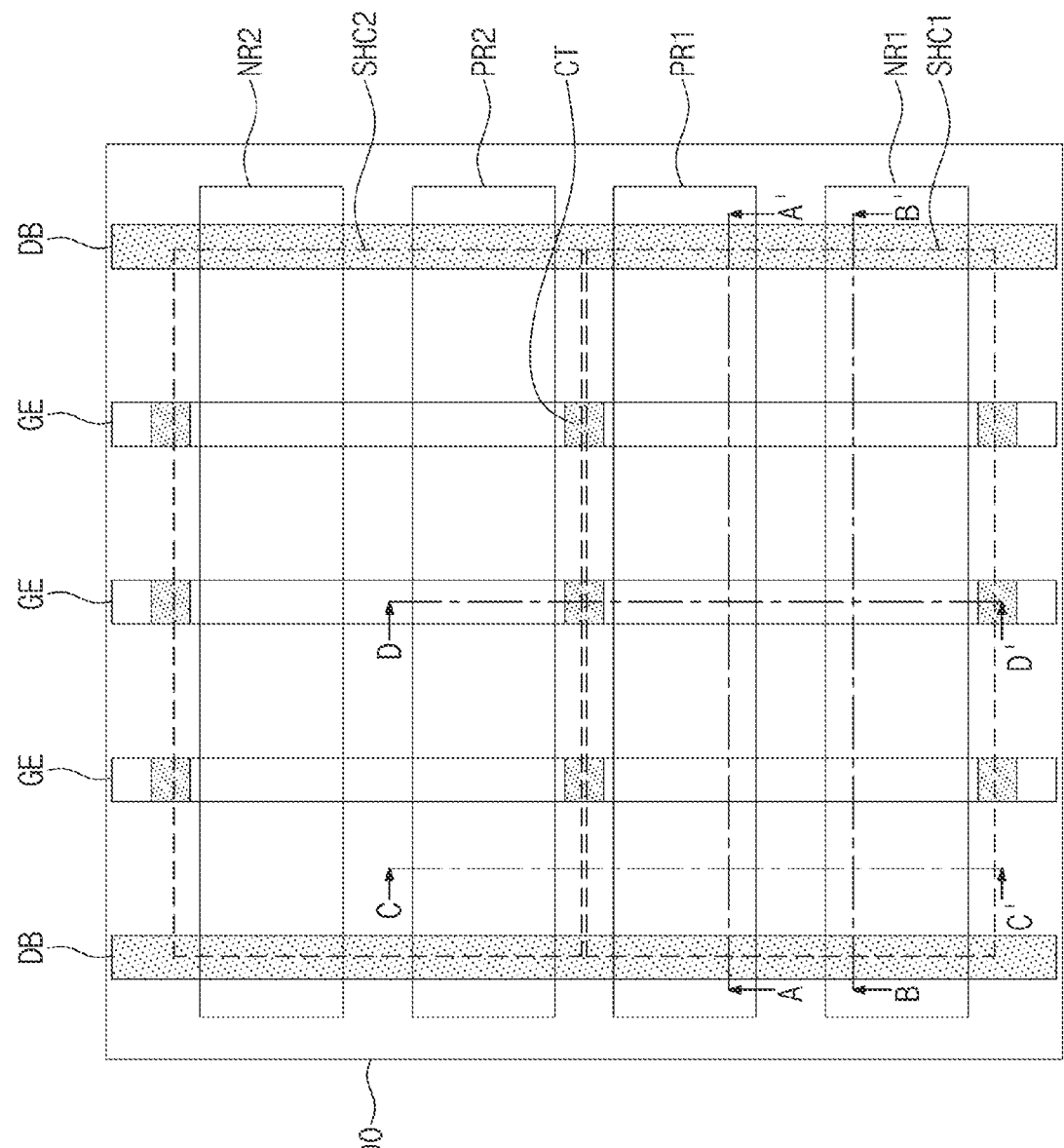
FIG. 9 illustrates a plan view further descriptive of a method of fabricating a semiconductor device according to embodiments of the inventive concepts.

FIGS. 7, 9, 11, 13, and 15 illustrate plan views descriptive of a method of fabricating a semiconductor device, according to embodiments of the inventive concepts. FIGS. 8A, 10A, 12A, 14A, and 16A illustrate sectional views respectively taken along lines A-A' of FIGS. 7, 9, 11, 13, and 15. FIGS. 8B, 10B, 12B, 14B, and 16B illustrate sectional views respectively taken along lines B-B' of FIGS. 7, 9, 11, 13, and 15. FIGS. 8C, 10C, 12C, 14C, and 16C illustrate sectional views respectively taken along lines C-C' of FIGS. 7, 9, 11, 13, and 15. FIGS. 8D and 10D illustrate sectional views respectively taken along lines D-D' of FIGS. 7 and 9.

Referring to FIGS. 7 and 8A to 8D, the substrate 100 with the first PMOSFET region PR1, the second PMOSFET region PR2, the first NMOSFET region NR1, and the second NMOSFET region NR2 may be provided. The first NMOSFET region NR1 and the first PMOSFET region PR1 may define the first single height cell SHC1, and the second NMOSFET region NR2 and the second PMOSFET region PR2 may define the second single height cell SHC2.

The substrate 100 may be patterned to form the first and second active patterns AP1 and AP2. The first active patterns AP1 may be formed on each of the first and second PMOSFET regions PR1 and PR2. The second active patterns AP2 may be formed on each of the first and second NMOSFET regions NR1 and NR2.

The device isolation layer ST may be formed on the substrate 100. The device isolation layer ST may be formed of or include an insulating material (e.g., silicon oxide). The device isolation layer ST may be recessed to expose an upper portion of each of the first and second active patterns AP1 and AP2. Thus, the upper portion of each of the first and second active patterns AP1 and AP2 may protrude vertically above the device isolation layer ST.

Sacrificial patterns SAP may be formed to cross the first and second active patterns AP1 and AP2. The sacrificial patterns SAP may be line- or bar-shaped patterns extending in the first direction D1.

In detail, the formation of the sacrificial patterns SAP may include forming a sacrificial layer on the substrate 100, forming mask patterns MA on the sacrificial layer, and patterning the sacrificial layer using the mask patterns MA as an etch mask. The sacrificial layer may be formed of or include polysilicon.

A pair of the gate spacers GS may be respectively formed on opposite side surfaces of each of the sacrificial patterns SAP. The formation of the gate spacers GS may include conformally forming a gate spacer layer to cover the entire top surface of the substrate 100 and anisotropically etching the gate spacer layer. The gate spacer layer may be formed of or include at least one of SiCN, SiCON, or SiN. Alternatively, the gate spacer layer may for example be a multi-layered structure including at least two of SiCN, SiCON, or SiN.

The first source/drain patterns SD1 may be formed in the upper portion of each of the first active patterns AP1. A pair of the first source/drain patterns SD1 may be formed at both sides of each of the sacrificial patterns SAP.

In detail, first recesses may be formed by etching the upper portion of the first active pattern AP1 using the mask patterns MA and the gate spacers GS as an etch mask. During the etching of the upper portion of the first active pattern AP1, the device isolation layer ST between the first active patterns AP1 may be recessed, as shown in FIG. 8C.

The first source/drain pattern SD1 may be formed by performing a selective epitaxial growth process using an inner surface of the first recess of the first active pattern AP1 as a seed layer. As a result of the formation of the first source/drain patterns SD1, the first channel pattern CH1 may be defined between each pair of the first source/drain patterns SD1. The selective epitaxial growth process may include a chemical vapor deposition (CVD) process or a molecular beam epitaxy (MBE) process. The first source/drain patterns SD1 may be formed of or include a semiconductor material (e.g., SiGe), whose lattice constant is larger than a lattice constant of the semiconductor material of the substrate 100. Each of the first source/drain patterns SD1 may be a multi-layered structure including a plurality of semiconductor layers.

In an embodiment, the first source/drain patterns SD1 may be doped with impurities in situ during the selective epitaxial growth process for forming the first source/drain patterns SD1. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at both sides of each of the sacrificial patterns SAP.

In detail, second recesses may be formed by etching an upper portion of the second active pattern AP2 using the mask patterns MA and the gate spacers GS as an etch mask. The second source/drain pattern SD2 may be formed by performing a selective epitaxial growth process using an inner surface of the second recess of the second active pattern AP2 as a seed layer. As a result of the formation of the second source/drain patterns SD2, the second channel pattern CH2 may be defined between each pair of the second source/drain patterns SD2. In an embodiment, the second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time.

Referring to FIGS. 9 and 10A to 10D, the first interlayer insulating layer 110 may be formed to cover the first and second source/drain patterns SD1 and SD2, the mask patterns MA, and the gate spacers GS. As an example, the first interlayer insulating layer 110 may include a silicon oxide layer.

The first interlayer insulating layer 110 may be planarized to expose top surfaces of the sacrificial patterns SAP. The planarization of the first interlayer insulating layer 110 may be performed using an etch-back or chemical-mechanical polishing (CMP) process. All of the mask patterns MA may be removed during the planarization process. As a result, a top surface of the first interlayer insulating layer 110 may be coplanar with the top surfaces of the sacrificial patterns SAP and the top surfaces of the gate spacers GS.

The sacrificial patterns SAP may be replaced with the gate electrodes GE, respectively. In detail, the exposed sacrificial patterns SAP may be selectively removed. Empty spaces may be formed as a result of the removal of the sacrificial patterns SAP. The gate dielectric pattern GI, the gate electrode GE, and the gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a metallic material having a low resistance.

During the replacing of the sacrificial pattern SAP with the gate electrode GE, the gate cutting patterns CT may be formed on the gate electrode GE. The gate cutting patterns CT may be formed to divide each gate electrode GE into a plurality of gate electrodes GE.

The second interlayer insulating layer 120 may be formed on the first interlayer insulating layer 110. The second interlayer insulating layer 120 may be formed of or include silicon oxide. A pair of the separation structures DB may be respectively formed at both sides of the first single height cell SHC1. The separation structures DB may respectively overlap with the gate electrodes GE, which are formed at both sides of the first single height cell SHC1. For example, the formation of the separation structures DB may include forming a hole, which is extended into the first and second active patterns AP1 and AP2 through the first and second interlayer insulating layers 110 and 120 and the gate electrode GE, and then filling the hole with an insulating layer.

Referring to FIGS. 11 and 12A to 12C, a hard mask pattern HMP and a mask layer ML may be formed on the second interlayer insulating layer 120. In detail, a hard mask layer and the mask layer ML may be sequentially formed on the second interlayer insulating layer 120. A plurality of openings OP may be formed in the mask layer ML through a photolithography process. The hard mask pattern HMP with a plurality of openings OP may be formed by patterning the hard mask layer using the mask layer ML. The hard mask pattern HMP may include a metal nitride layer (e.g., a titanium nitride layer), and the mask layer ML may include a silicon oxide layer.

The openings OP of the hard mask pattern HMP may include first openings OP1, second openings OP2, and third openings OP3. The first to third openings OP1, OP2, and OP3 may define the first to third active contacts AC1, AC2, and AC3, respectively, which were previously described with reference to FIG. 4.

A first mold layer MLD1 may be formed on the mask layer ML. The first mold layer MLD1 may have a flat top surface. A second mold layer MLD2 may be formed on the first mold layer MLD1. The second mold layer MLD2 may be patterned through a photolithography process to be left on only the device isolation layer ST filling the second trench TR2. In other words, when viewed in a plan view, the second mold layer MLD2 may extend on the device isolation layer ST filling the second trench TR2 and in the second direction D2.

The first mold layer MLD1 may be patterned using the second mold layer MLD2 as a mask. Referring back to FIG.

12C, the first mold layer MLD1 may be in direct contact with the top surface of the second interlayer insulating layer 120 in the first openings OP1. The first mold layer MLD1 may include a carbon-containing layer (e.g., SOH. The second mold layer MLD2 may be formed of or include silicon nitride or silicon oxynitride.

Referring to FIGS. 13 and 14A to 14C, a first etching process may be performed on the substrate 100. The first etching process may be an anisotropic etching process. The second interlayer insulating layer 120, which is exposed through the openings OP, may be etched by the first etching process. The first etching process may be performed until the top surface of the first interlayer insulating layer 110 is exposed through the openings OP. However, the first etching process is not limited to this example and may be performed in such a way that a portion of the second interlayer insulating layer 120 is left or an upper portion of the first interlayer insulating layer 110 is etched.

Figure 14A:
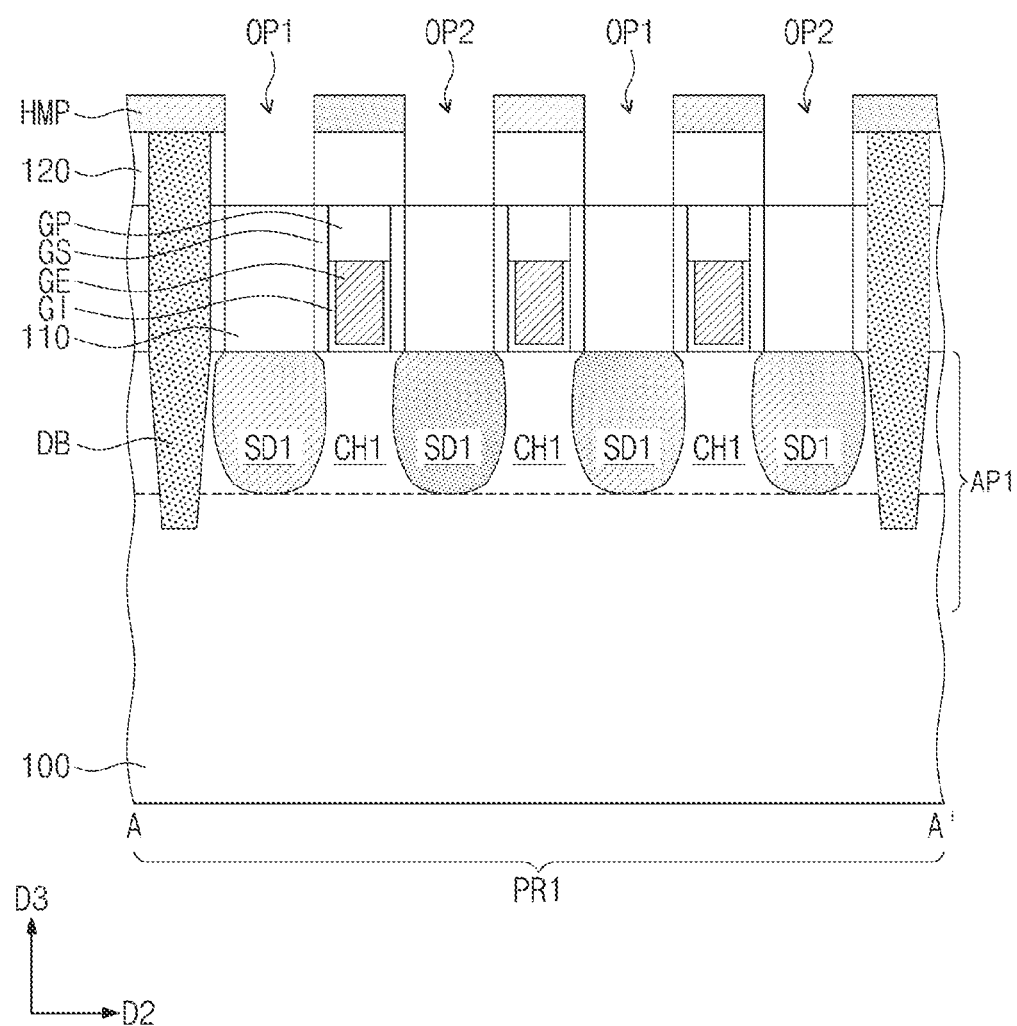
FIGS. 14A, 14B and 14C illustrate sectional views respectively taken along lines A-A', B-B' and C-C' of FIG. 13.
Figure 14B:
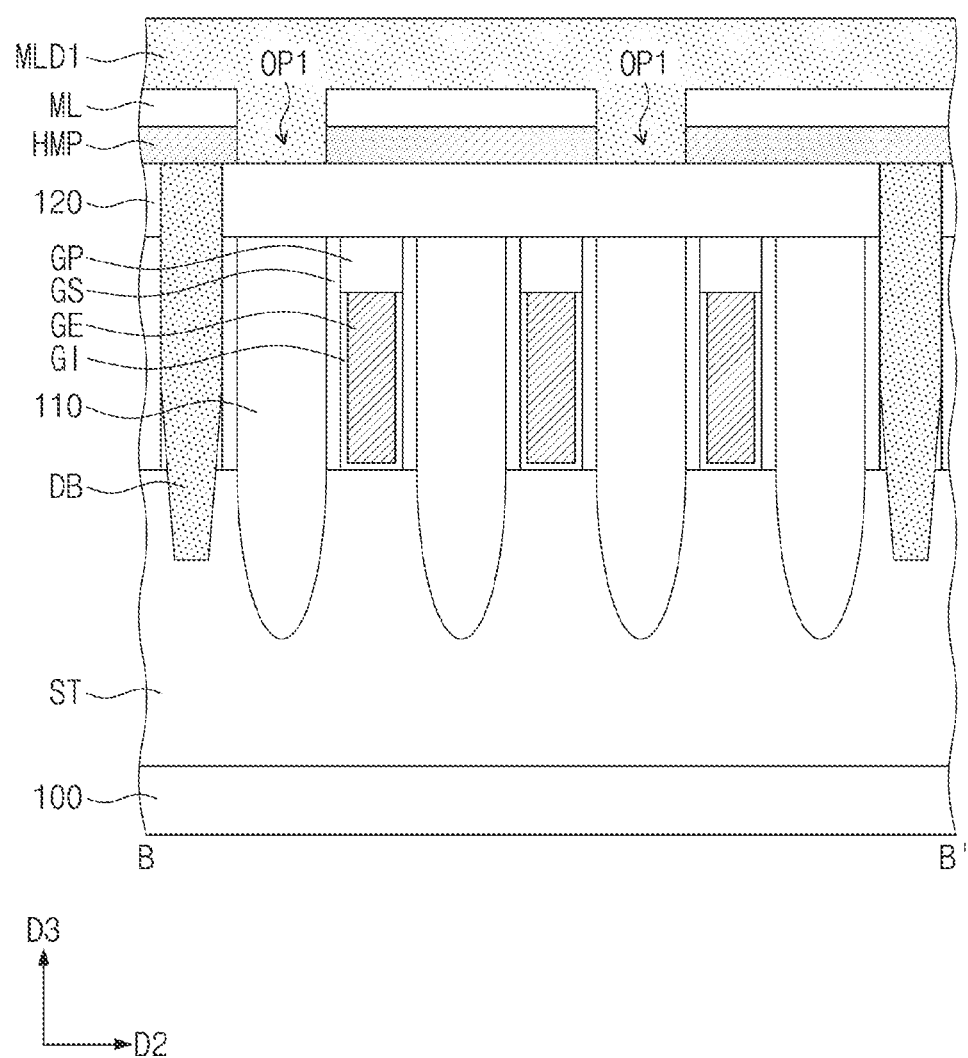

The mask layer ML may be removed during the first etching process, and thus, the hard mask pattern HMP may be exposed (see FIG. 14A). The second mold layer MLD2 may be removed during the first etching process, and thus, the first mold layer MLD1 may be exposed.

Referring back to FIG. 14C, due to the first etching process, a level of a top surface of the interlayer insulating layer exposed through the first opening OP1 may vary depending on position. For example, the top surface of the interlayer insulating layer (i.e., the top surface of the first interlayer insulating layer 110) on the first PMOSFET region PR1 and the first NMOSFET region NR1 may be located at a first level LV1. In contrast, the top surface of the interlayer insulating layer (i.e., the top surface of the second interlayer insulating layer 120) on the device isolation layer ST filling the second trench TR2 may be located at a second level LV2. The second level LV2 may be higher than the first level LV1.

Referring to FIGS. 15 and 16A to 16C, the exposed first mold layer MLD1 may be selectively removed. The removal of the first mold layer MLD1 may include performing an ashing process.

Thereafter, a second etching process may be performed using the hard mask pattern HMP as an etch mask. The second etching process may be an anisotropic etching process. The first interlayer insulating layer 110 exposed through the opening OP may be etched by the second etching process. The second etching process may be performed until the first and second source/drain patterns SD1 and SD2 are exposed through the openings OP. An upper portion of each of the first and second source/drain patterns SD1 and SD2 may be removed during the second etching process.

Referring back to FIG. 16C, as a result of the second etching process, the first opening OP1 may be formed to expose the first source/drain pattern SD1 and the second source/drain pattern SD2. The first opening OP1 may expose the first interlayer insulating layer 110 between the first and second source/drain patterns SD1 and SD2.

In an embodiment, the second etching process may be performed in an over-etching manner to remove the upper portion of each of the first and second source/drain patterns SD1 and SD2, and in this case, the first interlayer insulating layer 110 between the first and second source/drain patterns SD1 and SD2 may be recessed to a deeper level, compared with the first and second source/drain patterns SD1 and SD2. For example, the lowermost level of the first opening OP1 may be a third level LV3, which is lower than the top surface of each of the first and second source/drain patterns SD1 and SD2.

Meanwhile, the highest level of the first interlayer insulating layer 110 on the device isolation layer ST filling the second trench TR2 may be a fourth level LV4. The fourth level LV4 may be higher than the third level LV3.

Figure 14C:
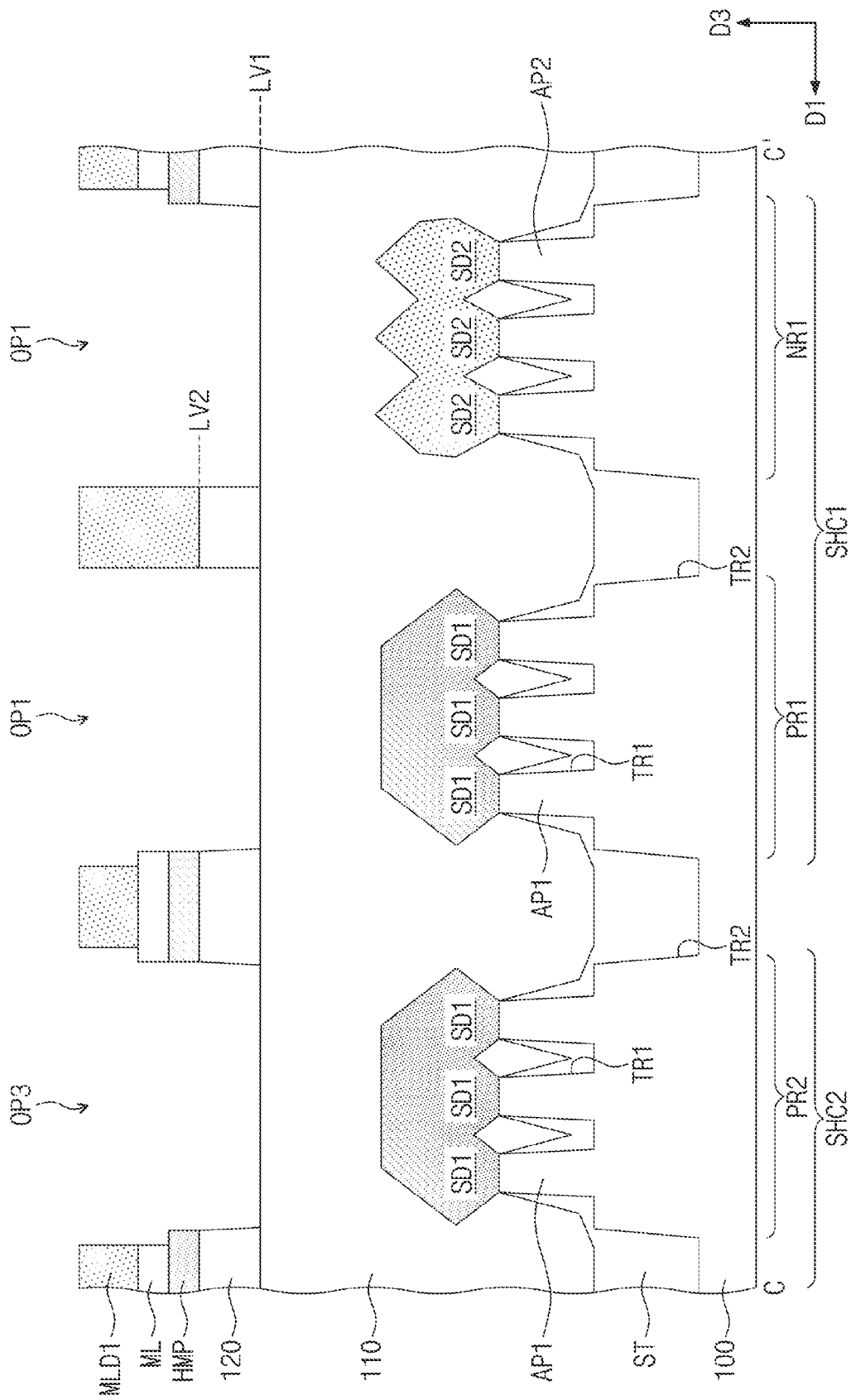
Figure 15:
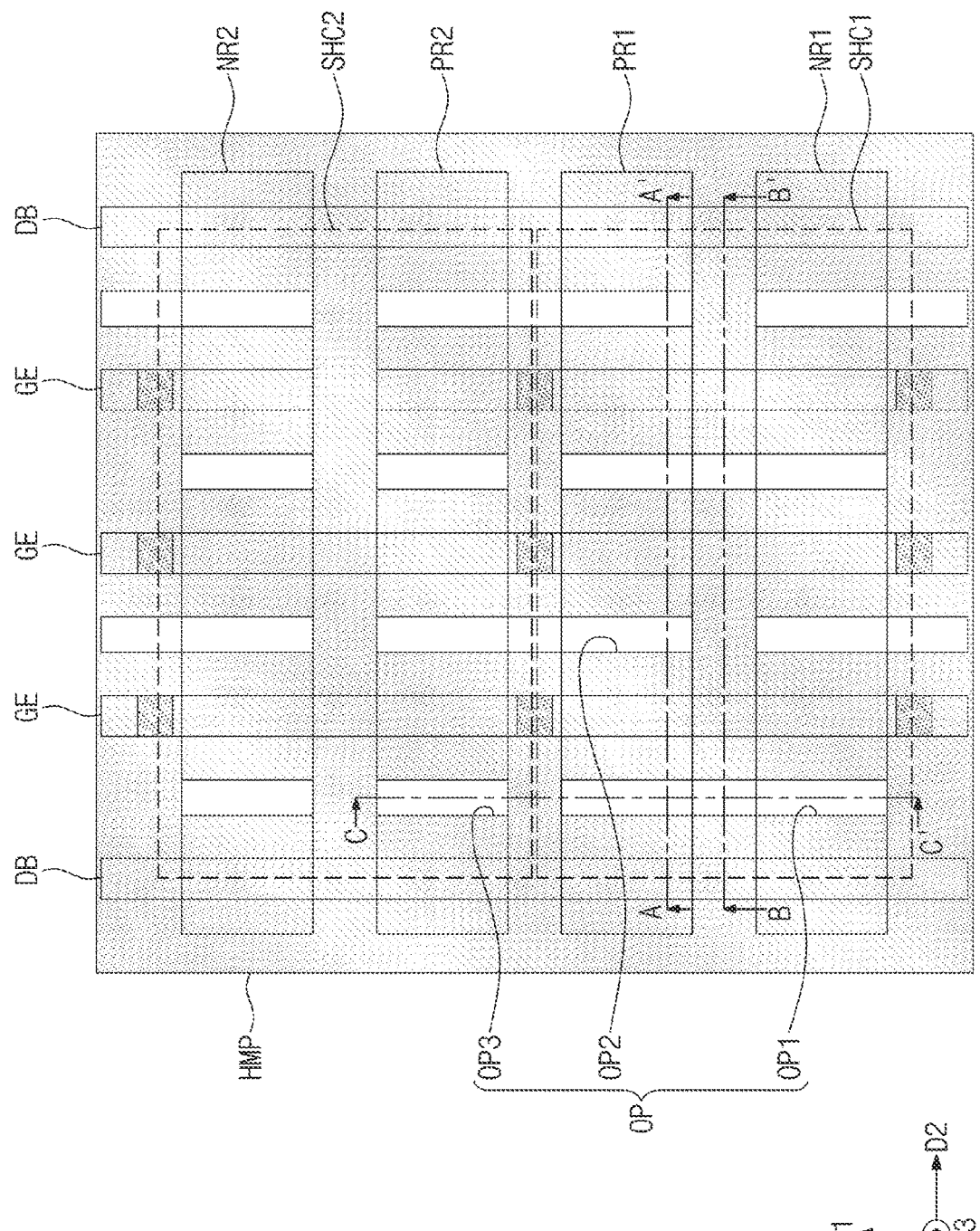
FIG. 15 illustrates a plan view further descriptive of a method of fabricating a semiconductor device according to embodiments of the inventive concepts.

That is, in the present embodiment, the top surface of the first interlayer insulating layer 110 between the first and second source/drain patterns SD1 and SD2 may be formed at the fourth level LV4 higher than the third level LV3, and this may be because the top surface of the interlayer insulating layer on the device isolation layer ST filling the second trench TR2 is formed at a relatively high level, as previously described with reference to FIG. 14C. In other words, by virtue of the structure shown in FIG. 14C where a portion of the second interlayer insulating layer 120 having a top surface at the second level LV2 is located above a portion of second trench TR2, it may be possible to prevent the top surface of the first interlayer insulating layer 110 between the first and second source/drain patterns SD1 and SD2 from being excessively recessed in the second etching process. As a result, it may be possible to prevent the first active contact AC1 as having a structure causing the parasitic capacitance issue previously described with reference to FIG. 6.

Referring back to FIGS. 4 and 5A to 5E, the active contacts AC may be formed by filling the openings OP with a conductive material. The upper insulating pattern UIP may be formed by replacing an upper portion of each of the active contacts AC with an insulating material. The gate contacts GC may be formed to penetrate the second interlayer insulating layer 120 and the gate capping pattern GP and to be respectively connected to the gate electrodes GE.

The third interlayer insulating layer 130 may be formed on the second interlayer insulating layer 120. The first metal layer M1 may be formed in the third interlayer insulating layer 130. The formation of the first metal layer M1 may include forming the first power line M1_R1, the second power line M1_R2, the third power line M1_R3, and the first interconnection lines M1_I.

The fourth interlayer insulating layer 140 may be formed on the first metal layer M1. The second metal layer M2 may be formed in the fourth interlayer insulating layer 140. The formation of the second metal layer M2 may include forming the second interconnection lines M2_I. In an embodiment, the second interconnection lines M2_I may be formed by a dual damascene process.

FIGS. 17, 18, 19 and 20 illustrate sectional views descriptive of a method of forming an opening, according to embodiments of the inventive concepts. In the following description, elements previously described with reference to FIGS. 7 to 16C may be respectively identified by the same reference numbers without repeating overlapping description thereof.

Figure 10A:
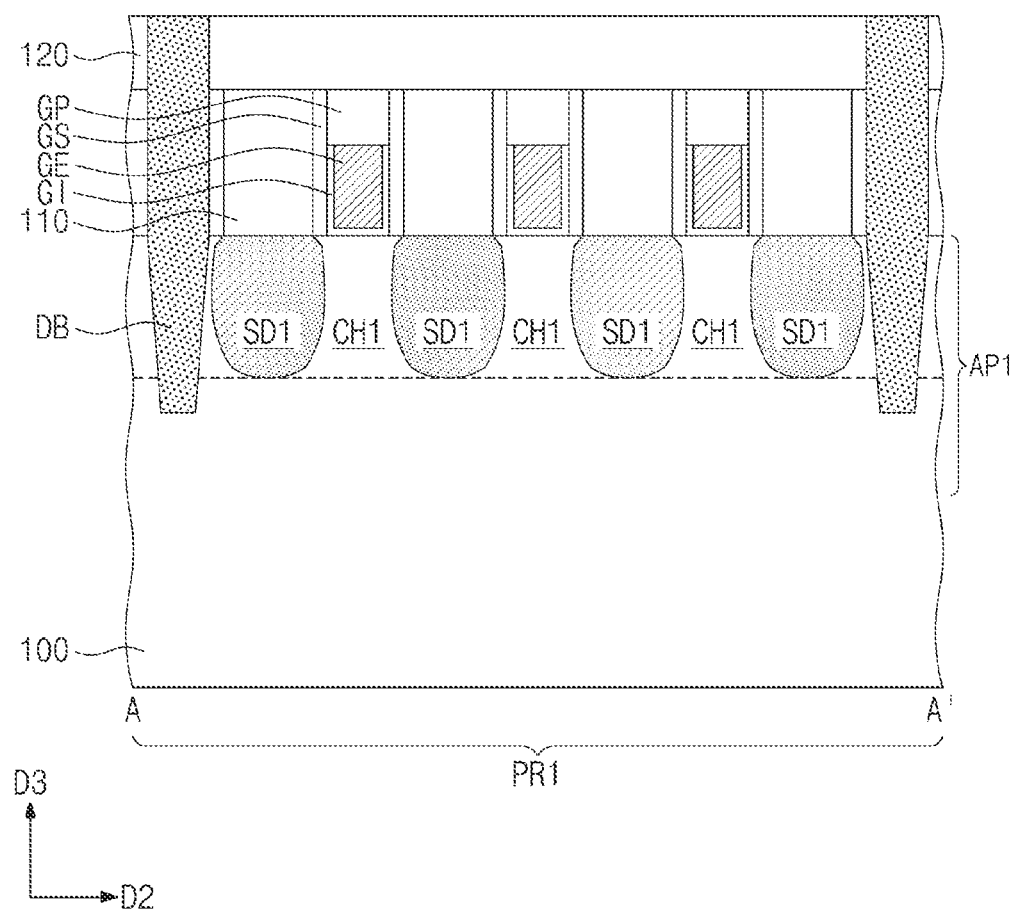
FIGS. 10A, 10B, 10C and 10D illustrate sectional views respectively taken along lines A-A', B-B', C-C' and D-D' of FIG. 9.
Figure 10B:
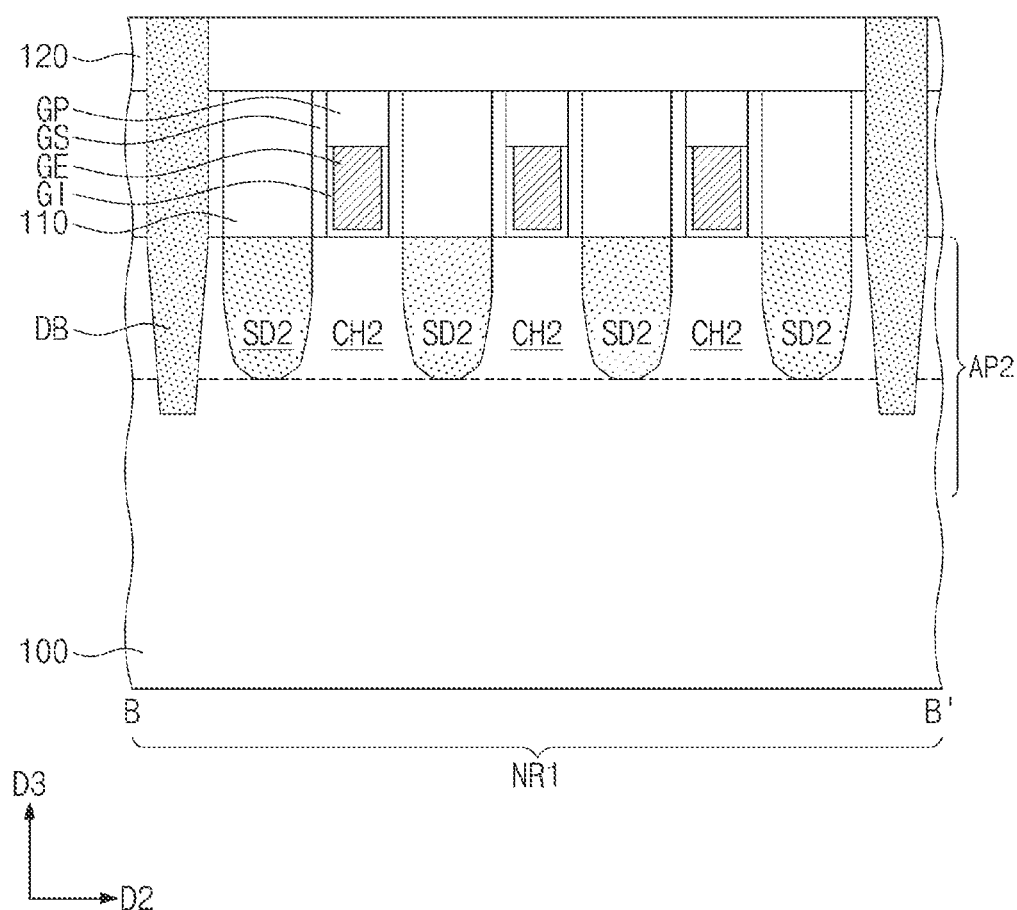
Figure 10C:
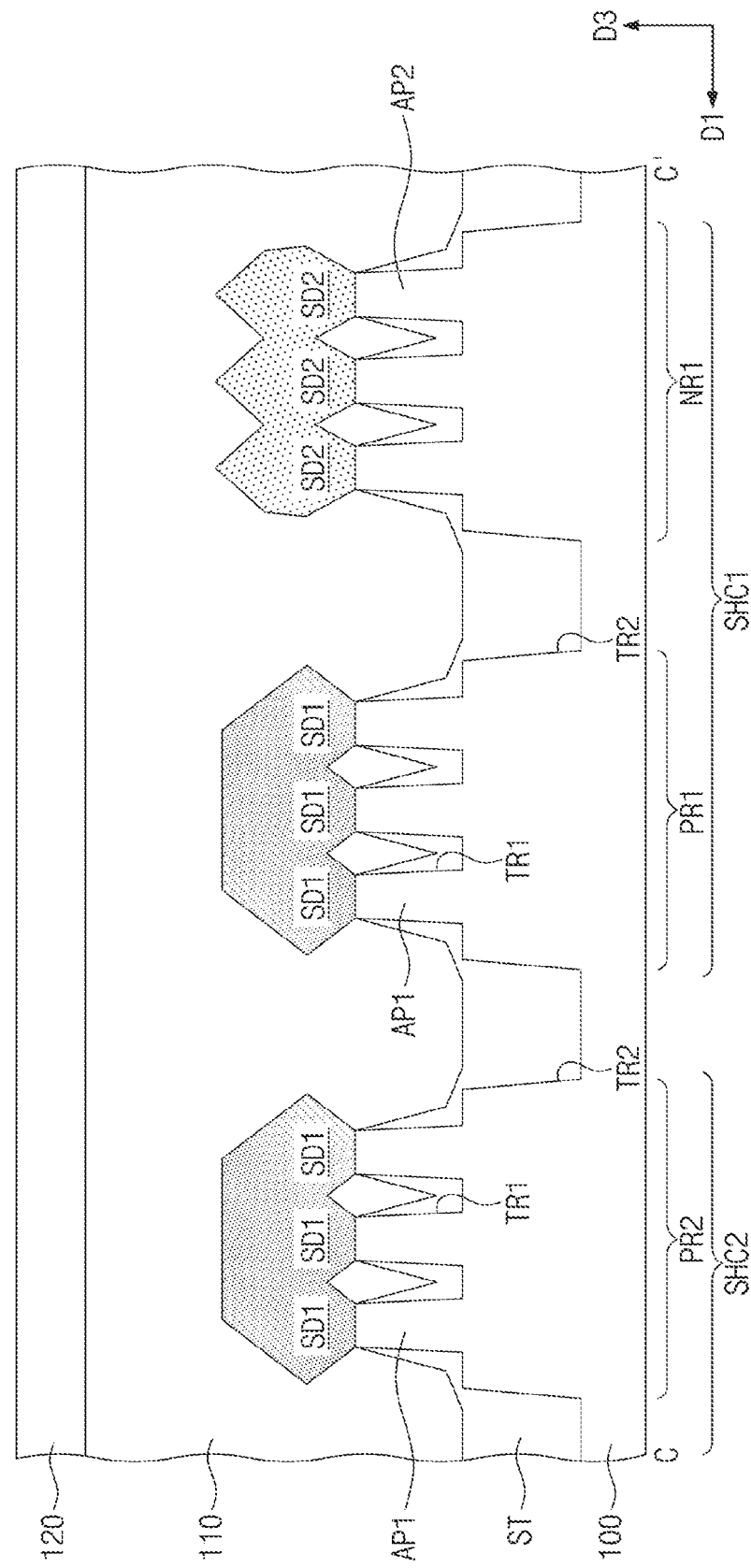
Figure 10D:
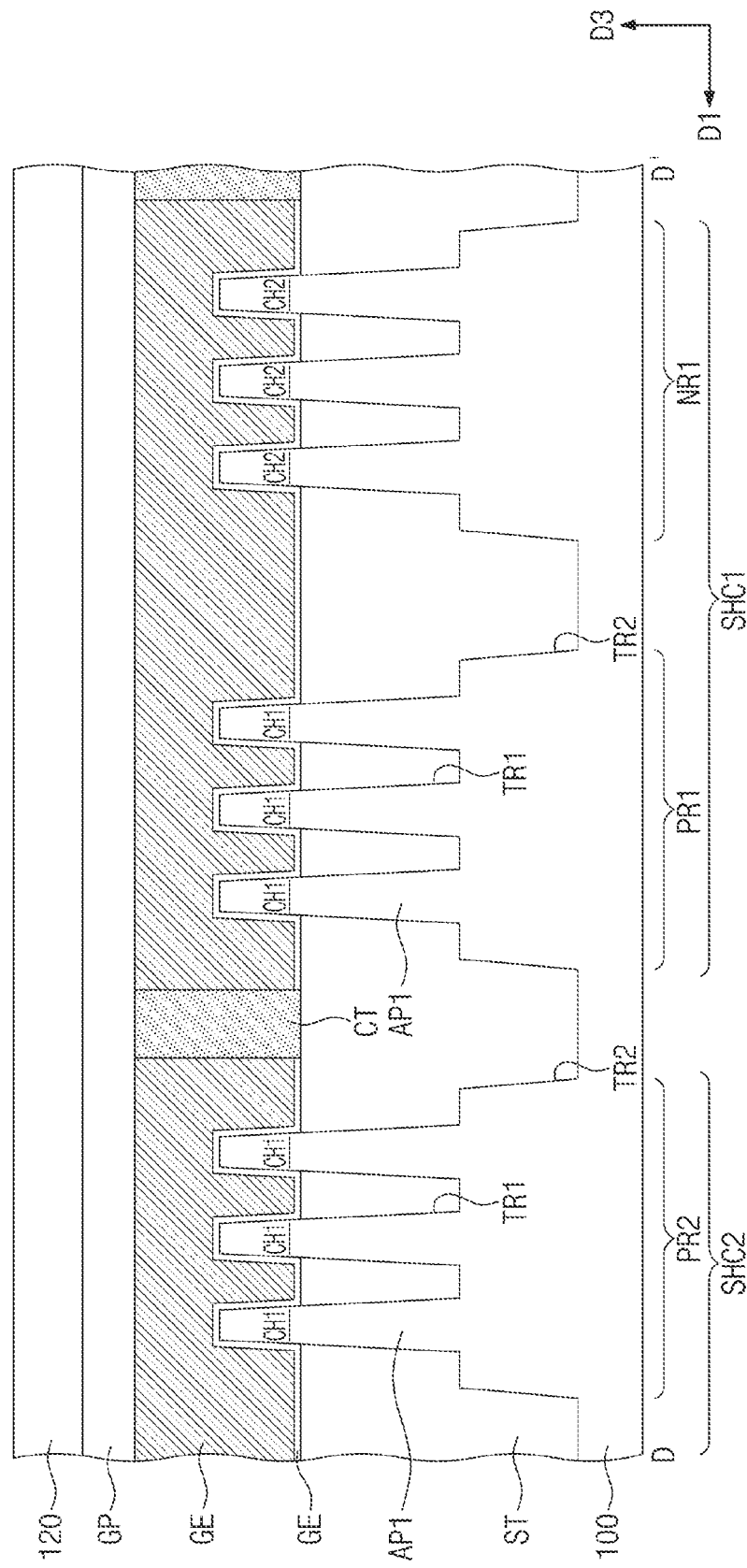
Figure 11:
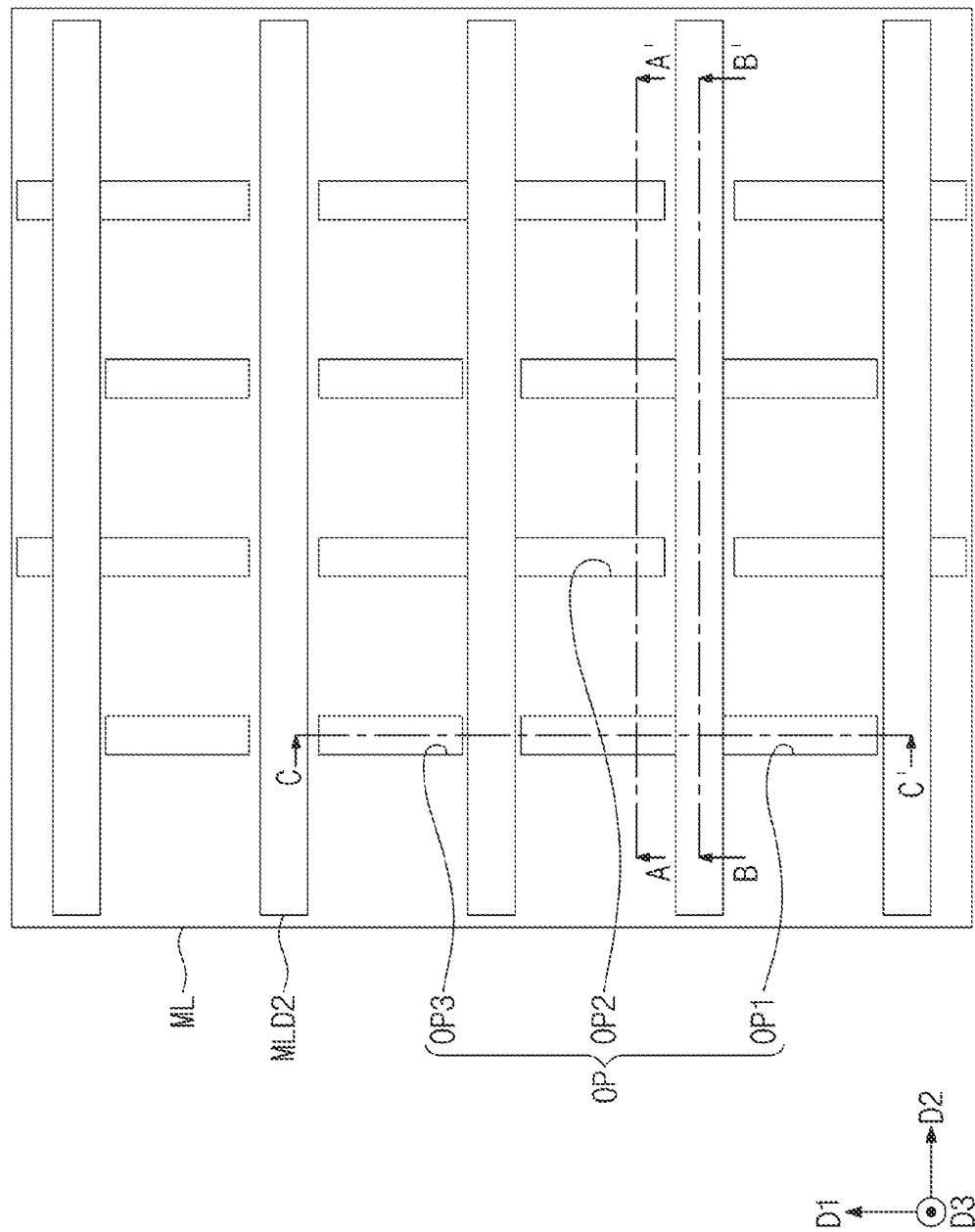
FIG. 11 illustrates a plan view further descriptive of a method of fabricating a semiconductor device according to embodiments of the inventive concepts.
Figure 12A:
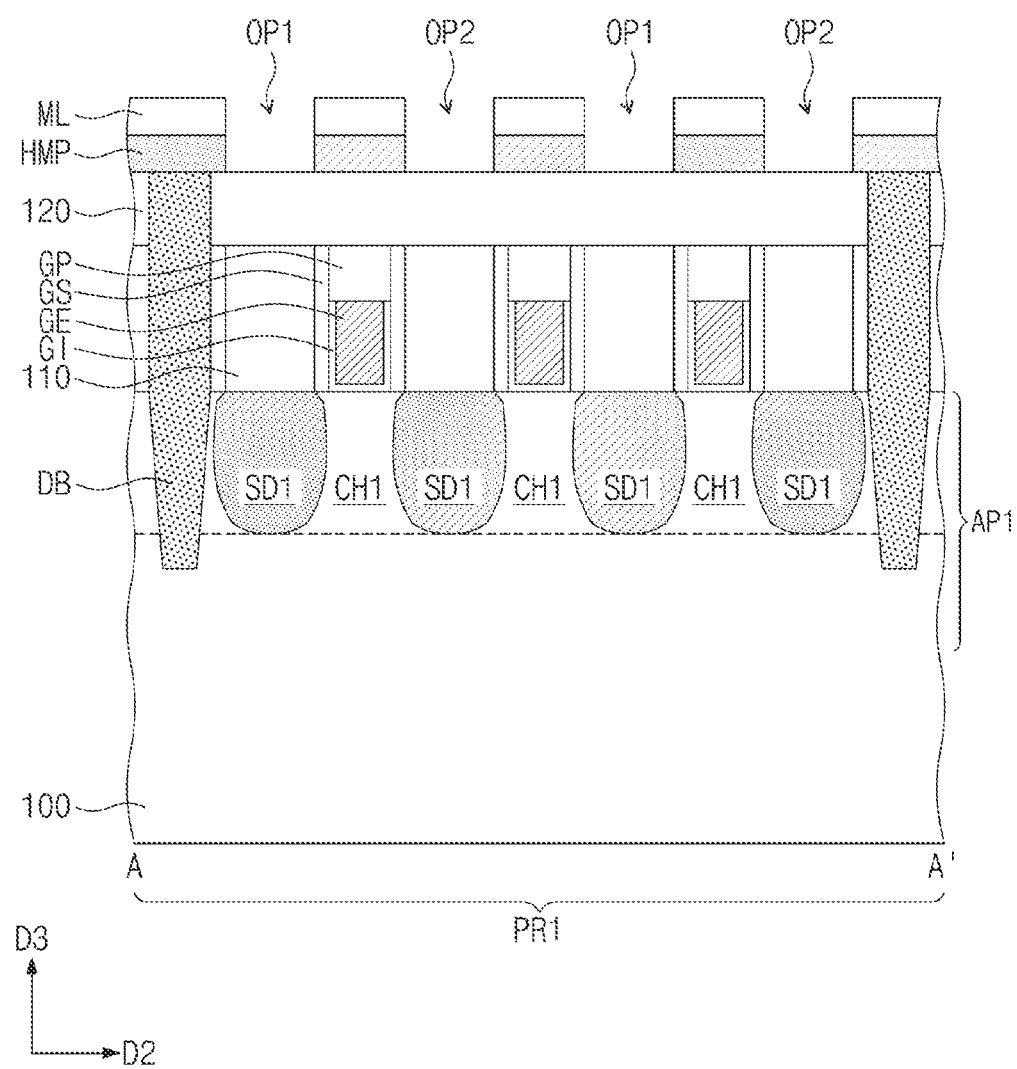
FIGS. 12A, 12B and 12C illustrate sectional views respectively taken along lines A-A', B-B' and C-C' of FIG. 11.
Figure 12B:
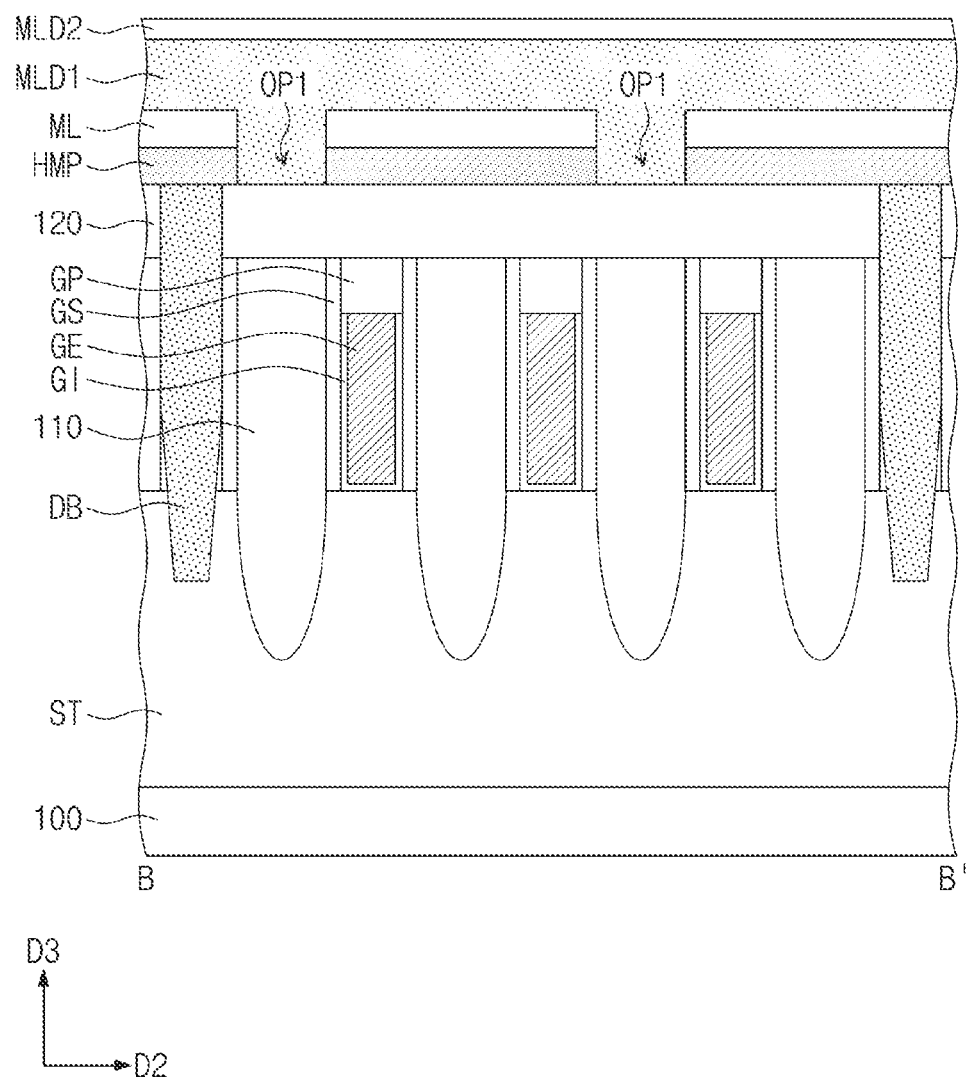
Figure 12C:
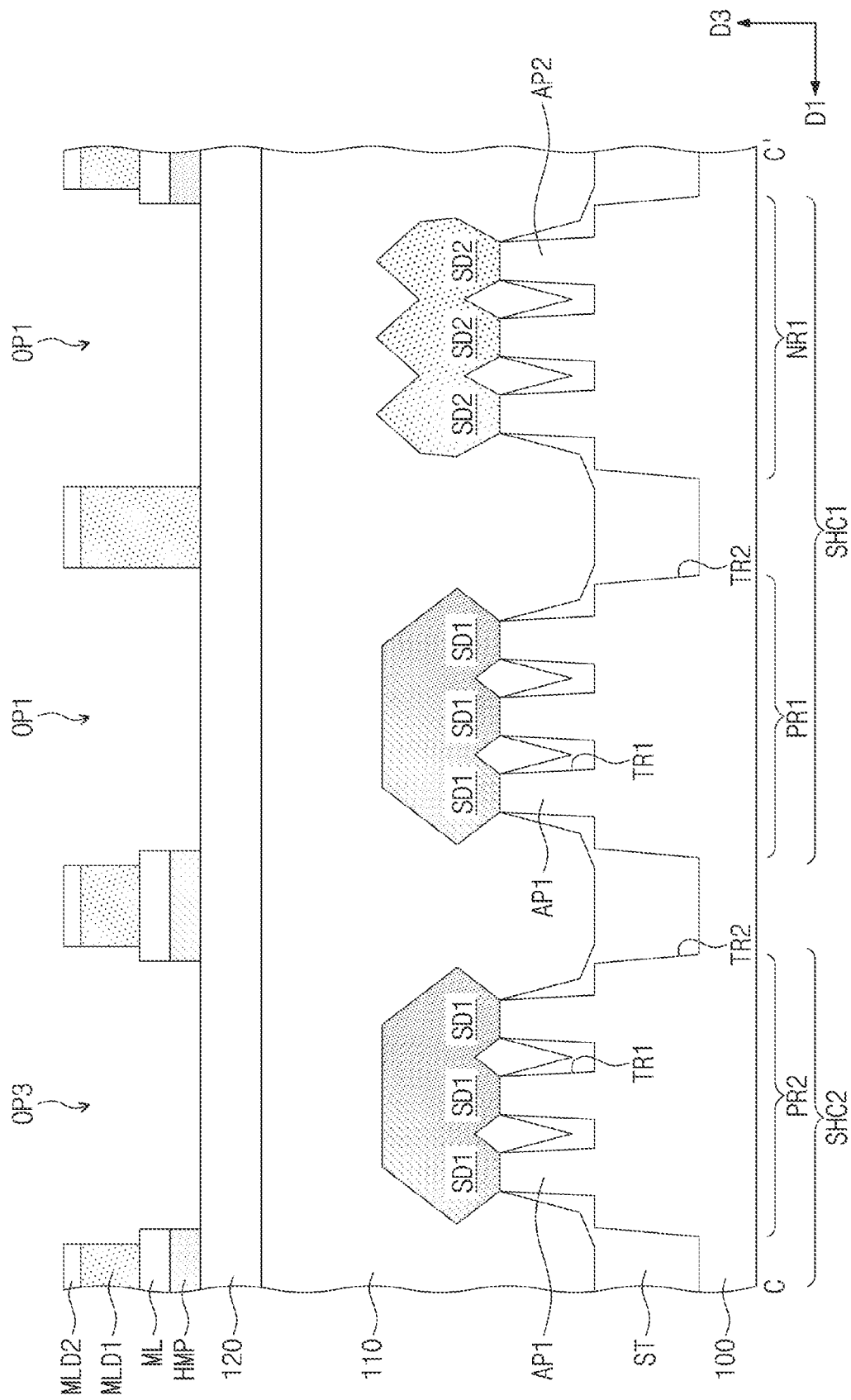
Figure 13:
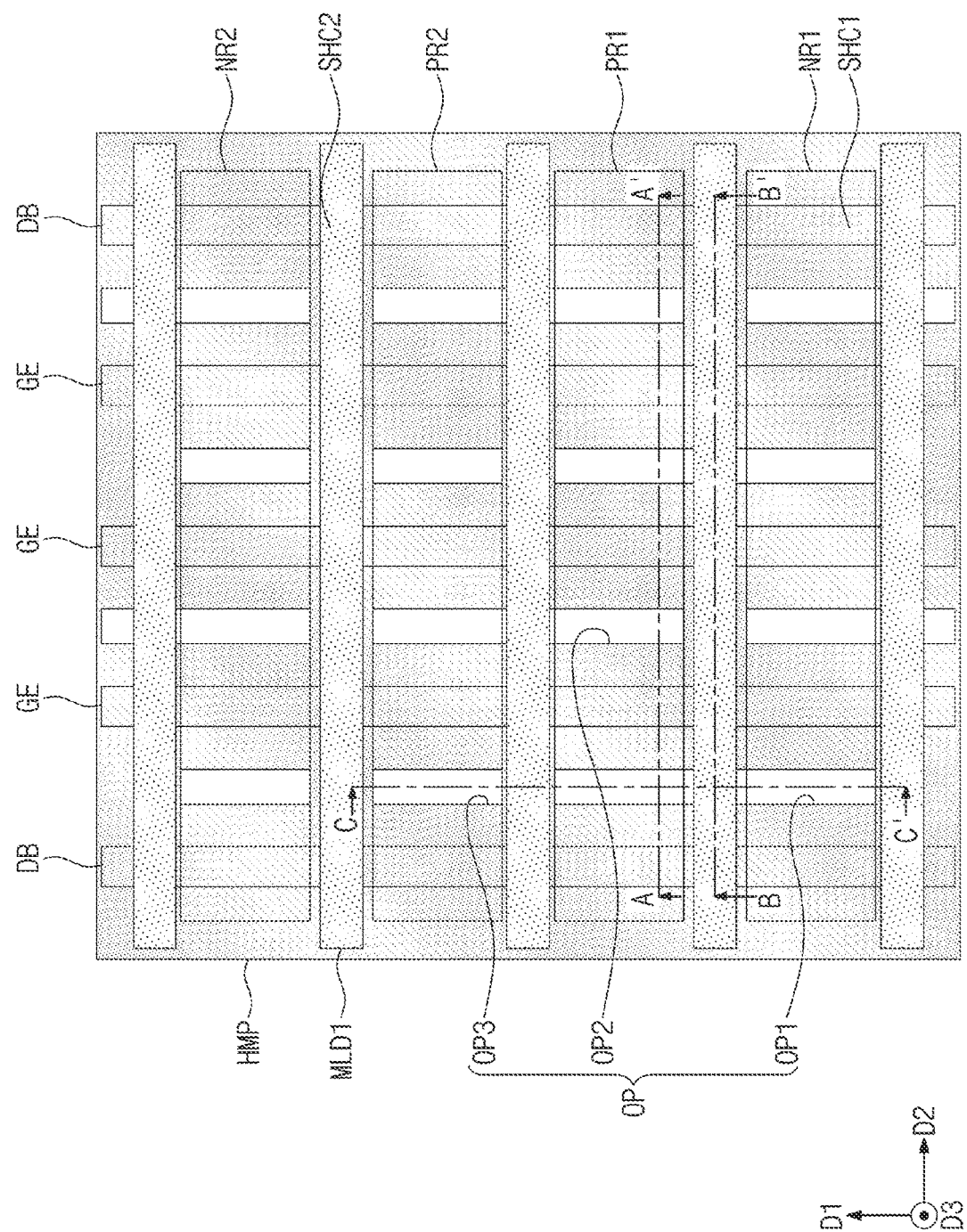
FIG. 13 illustrates a plan view further descriptive of a method of fabricating a semiconductor device according to embodiments of the inventive concepts.
Figure 17:
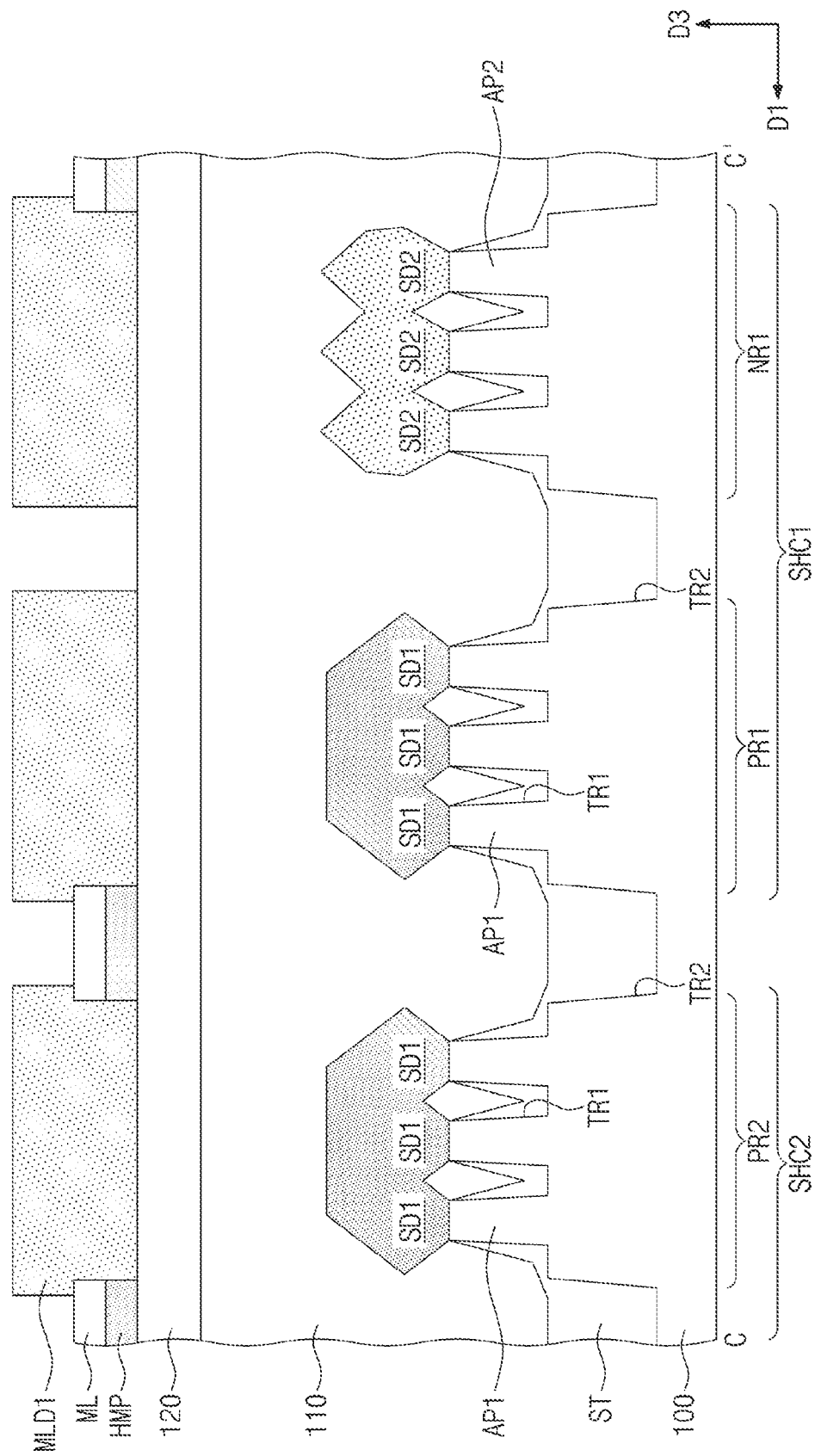
FIGS. 17, 18, 19 and 20 illustrate sectional views of a method of forming an opening, according to embodiments of the inventive concepts.

Referring to FIG. 17, the hard mask pattern HMP and the mask layer ML may be formed on the resulting structure of FIG. 10C. Thereafter, the first mold layer MLD1 may be formed. The first mold layer MLD1 may be selectively formed on only the first PMOSFET region PR1, the second PMOSFET region PR2, the first NMOSFET region NR1, and the second NMOSFET region NR2.

Figure 18:
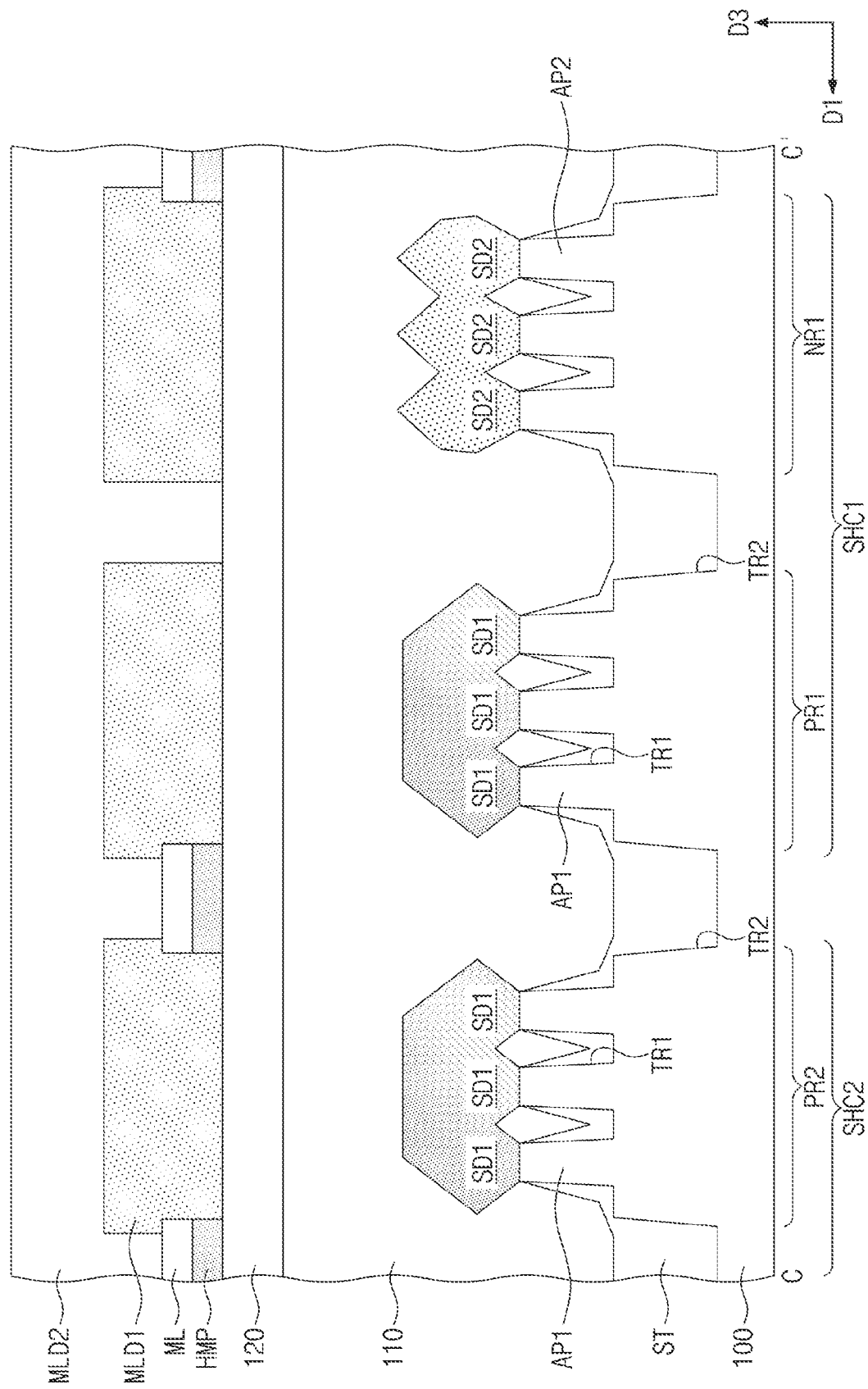

Referring to FIG. 18, the second mold layer MLD2 may be formed on the first mold layer MLD1. The second mold layer MLD2 may be formed to cover the entire top surface of the substrate 100. The second mold layer MLD2 may be formed of or include silicon oxide.

Figure 19:
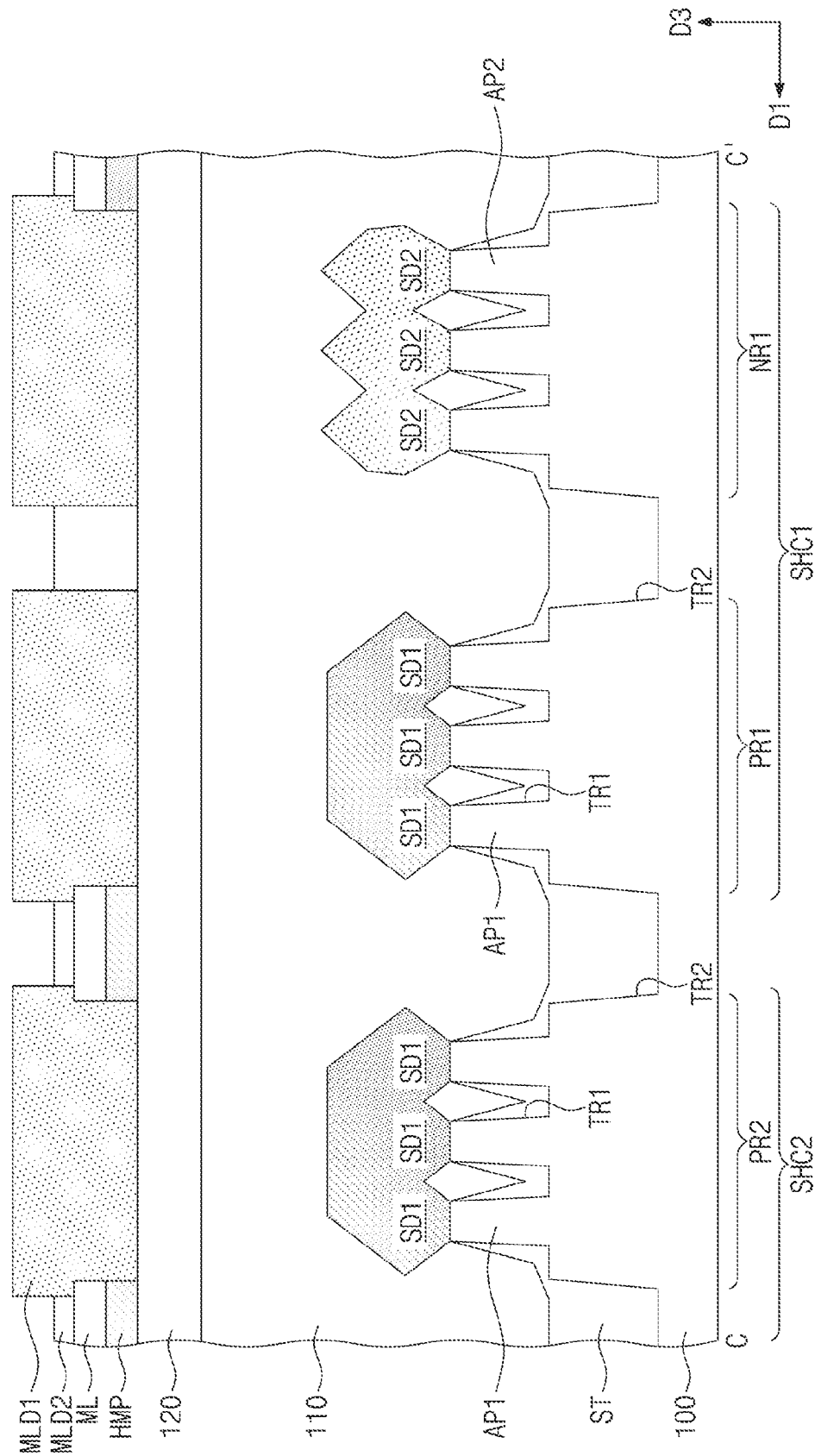

Referring to FIG. 19, the second mold layer MLD2 may be selectively etched back to expose an upper portion of the first mold layer MLD1. Since the second mold layer MLD2 is recessed, the first mold layer MLD1 may be exposed.

Figure 20:
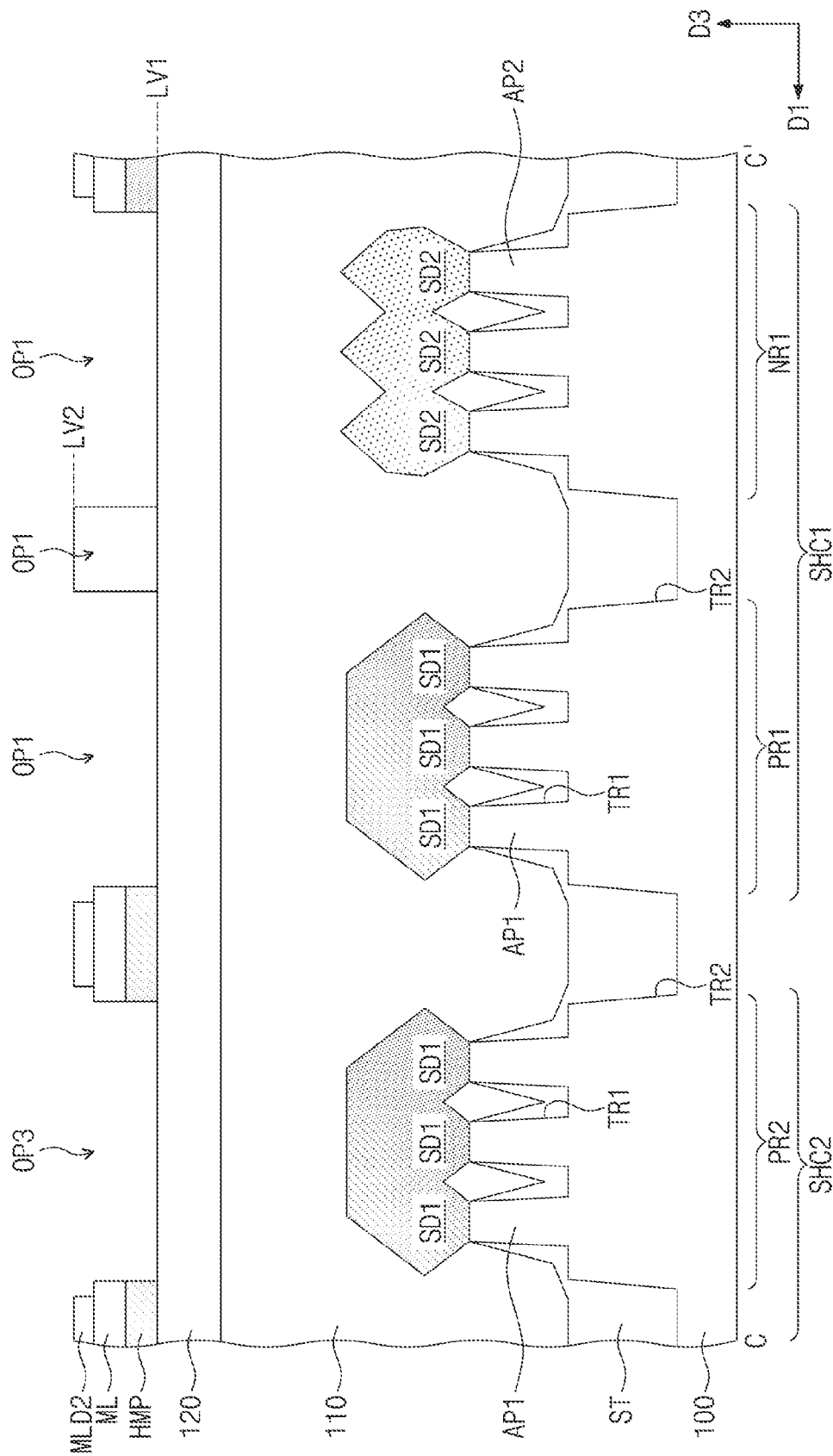

Referring to FIG. 20, the exposed first mold layer MLD1 may be selectively removed. The removal of the first mold layer MLD1 may include an ashing process.

Due to the removal of the first mold layer MLD1, a level of a top surface of an oxide layer exposed through the first opening OP1 may vary depending on position. For example, the top surface of the oxide layer (i.e., the top surface of the second interlayer insulating layer 120) on the first PMOSFET region PR1 and the first NMOSFET region NR1 may be located at the first level LV1. In contrast, the top surface of the oxide (i.e., a top surface of the second mold layer MLD2) on the device isolation layer ST filling the second trench TR2 may be located at the second level LV2. In an embodiment, the second level LV2 may be higher than the first level LV1.

Figure 16A:
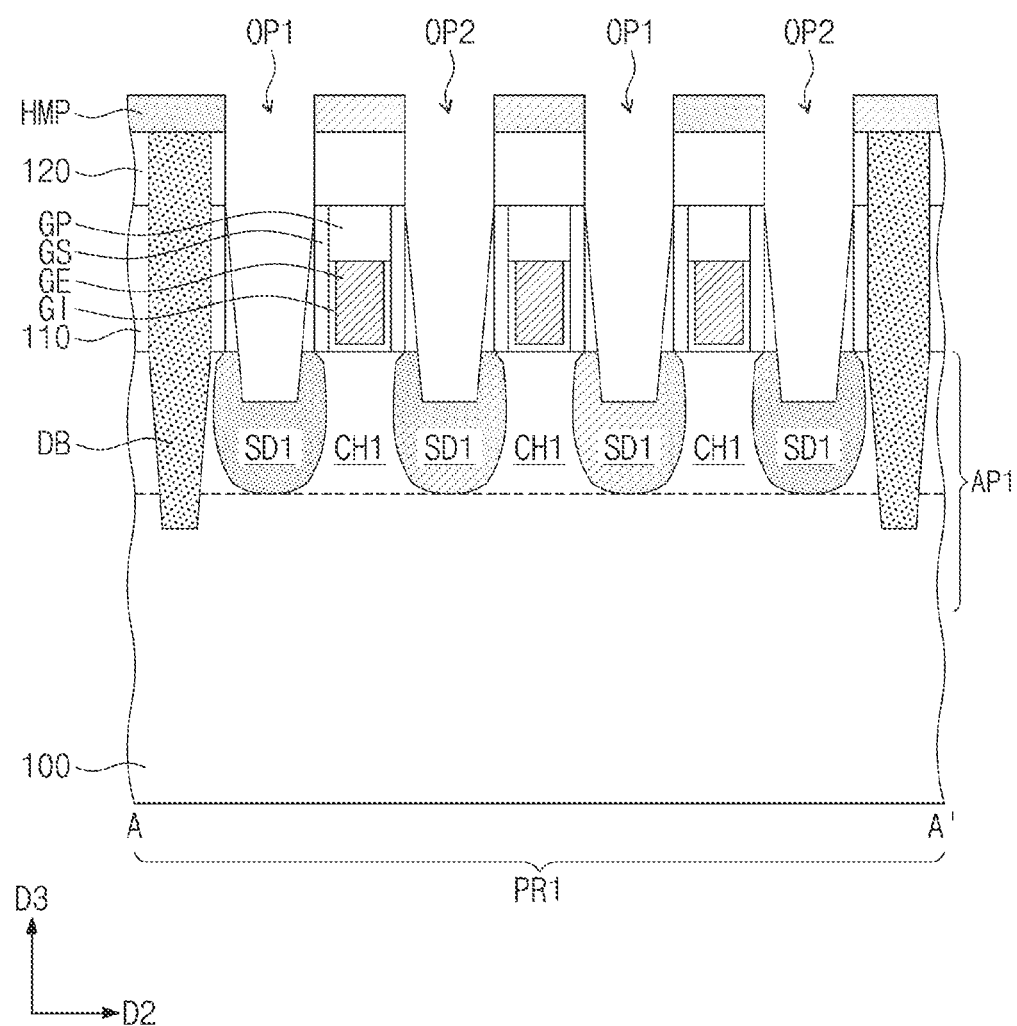
FIGS. 16A, 16B and 16C illustrate sectional views respectively taken along lines A-A', B-B' and C-C' of FIG. 15.
Figure 16B:
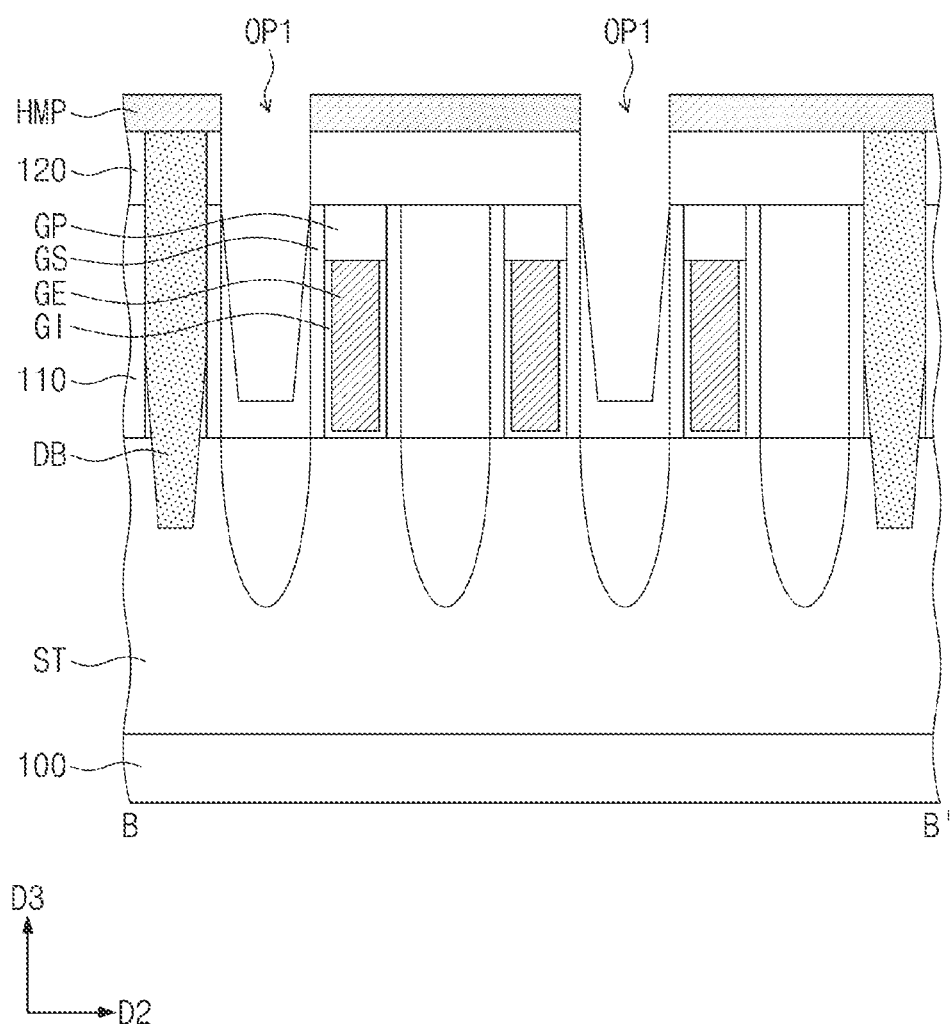
Figure 16C:
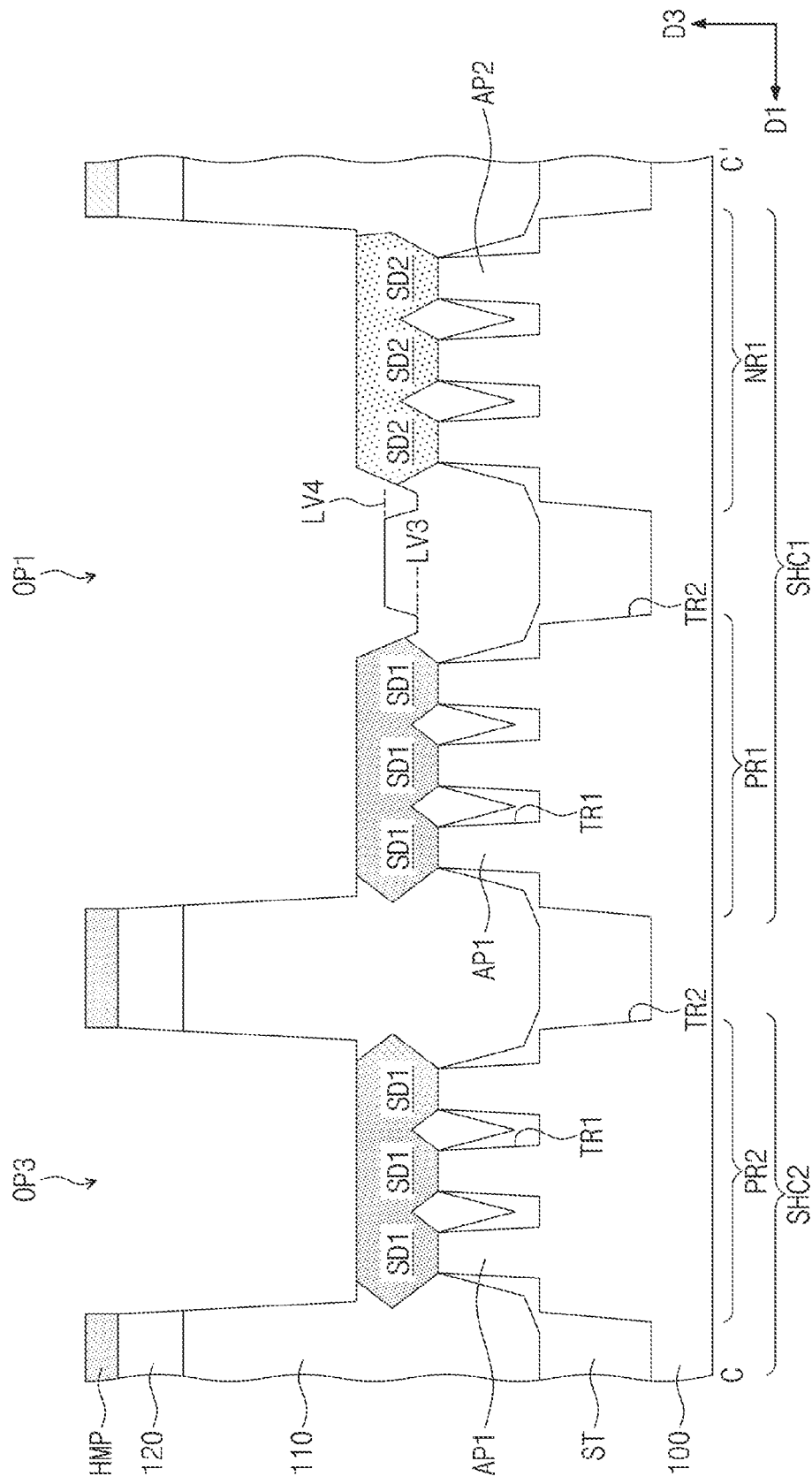

Thereafter, an anisotropic etching process using the hard mask pattern HMP as an etch mask may be performed to form the same structure as that of FIG. 16C.

Figure 21:
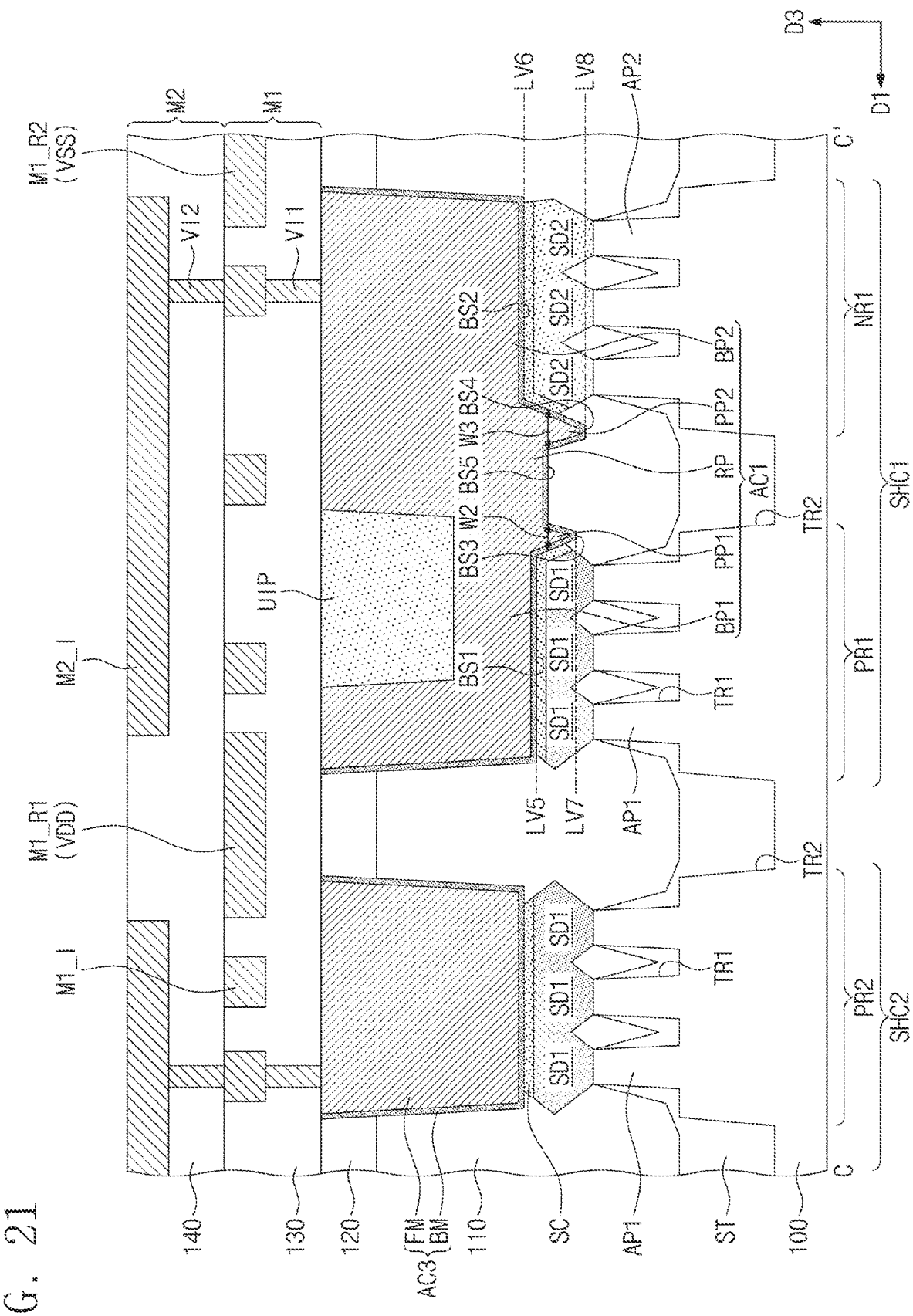
FIG. 21 illustrates a sectional view taken along the line C-C' of FIG. 4 of a semiconductor device according to embodiments of the inventive concepts.

FIG. 21 illustrates a sectional view taken along the line C-C' of FIG. 4 of a semiconductor device according to embodiments of the inventive concepts. In the following description, elements previously described with reference to FIGS. 4 and 5A to 5E may be respectively identified by the same reference numbers without repeating overlapping description thereof.

Referring to FIGS. 4 and 21, the bottom surface BS1 of the first body portion BP1 of the first active contact AC1 may be located at a fifth level LV5. The bottom surface BS2 of the second body portion BP2 of the first active contact AC1 may be located at a sixth level LV6. The fifth level LV5 may be lower than the sixth level LV6. In other words, during the etching process previously described with reference to FIGS. 15 and 16A to 16C, the first source/drain pattern SD1 may be more etched than the second source/drain pattern SD2. Thus, the bottom surface BS1 of the first body portion BP1 may be lower than the bottom surface BS2 of the second body portion BP2.

The largest width of the first protruding portion PP1 of the first active contact AC1 in the first direction D1 may be a second width W2. The largest width of the second protruding portion PP2 of the first active contact AC1 in the first direction D1 may be a third width W3. The third width W3 may be larger than the second width W2. The bottom surface BS3 of the first protruding portion PP1 may be located at a seventh level LV7. The bottom surface BS4 of the second protruding portion PP2 may be located at an eighth level LV8. The eighth level LV8 may be lower than the seventh level LV7.

FIGS. 22A to 22D illustrate sectional views, which are respectively taken along lines A-A', B-B', C-C', and E-E' of FIG. 4, of a semiconductor device according to embodiments of the inventive concepts. In the following description, elements previously described with reference to FIGS. 4 and 5A to 5E may respectively be identified by the same reference numbers without repeating overlapping description thereof.

Referring to FIGS. 4 and 22A to 22D, the substrate 100 including the first PMOSFET region PR1, the second PMOSFET region PR2, the first NMOSFET region NR1, and the second NMOSFET region NR2 may be provided. The device isolation layer ST may be provided on the substrate 100. The device isolation layer ST may define the first active pattern AP1 and the second active pattern AP2 in an upper portion of the substrate 100. The first active pattern AP1 may be defined on each of the first and second PMOSFET regions PR1 and PR2, and the second active pattern AP2 may be defined on each of the first and second NMOSFET regions NR1 and NR2.

The first active pattern AP1 may include the first channel patterns CH1, which are vertically stacked. The stacked first channel patterns CH1 may be spaced apart from each other in a third direction D3. The stacked first channel patterns CH1 may overlap with each other, when viewed in a plan view. The second active pattern AP2 may include the second channel patterns CH2, which are vertically stacked. The stacked second channel patterns CH2 may be spaced apart from each other in the third direction D3. The stacked second channel patterns CH2 may overlap with each other, when viewed in a plan view. The first and second channel patterns CH1 and CH2 may for example be formed of or include at least one of silicon (Si), germanium (Ge), or silicon-germanium (SiGe). In an embodiment, the third direction D3 may be characterized as extending orthogonally to an upper surface of the substrate 100, and the first and second directions D1 and D2 may be characterized as extending parallel to the upper surface of substrate 100.

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect each adjacent pair of the second source/drain patterns SD2 to each other.

The gate electrodes GE may be provided to cross the first and second channel patterns CH1 and CH2 and to extend in the first direction D1. The gate electrode GE may overlap with the first and second channel patterns CH1 and CH2, when viewed in a plan view. A pair of the gate spacers GS may be disposed on opposite side surfaces of the gate electrode GE. The gate capping pattern GP may be provided on the gate electrode GE.

Figure 22A:
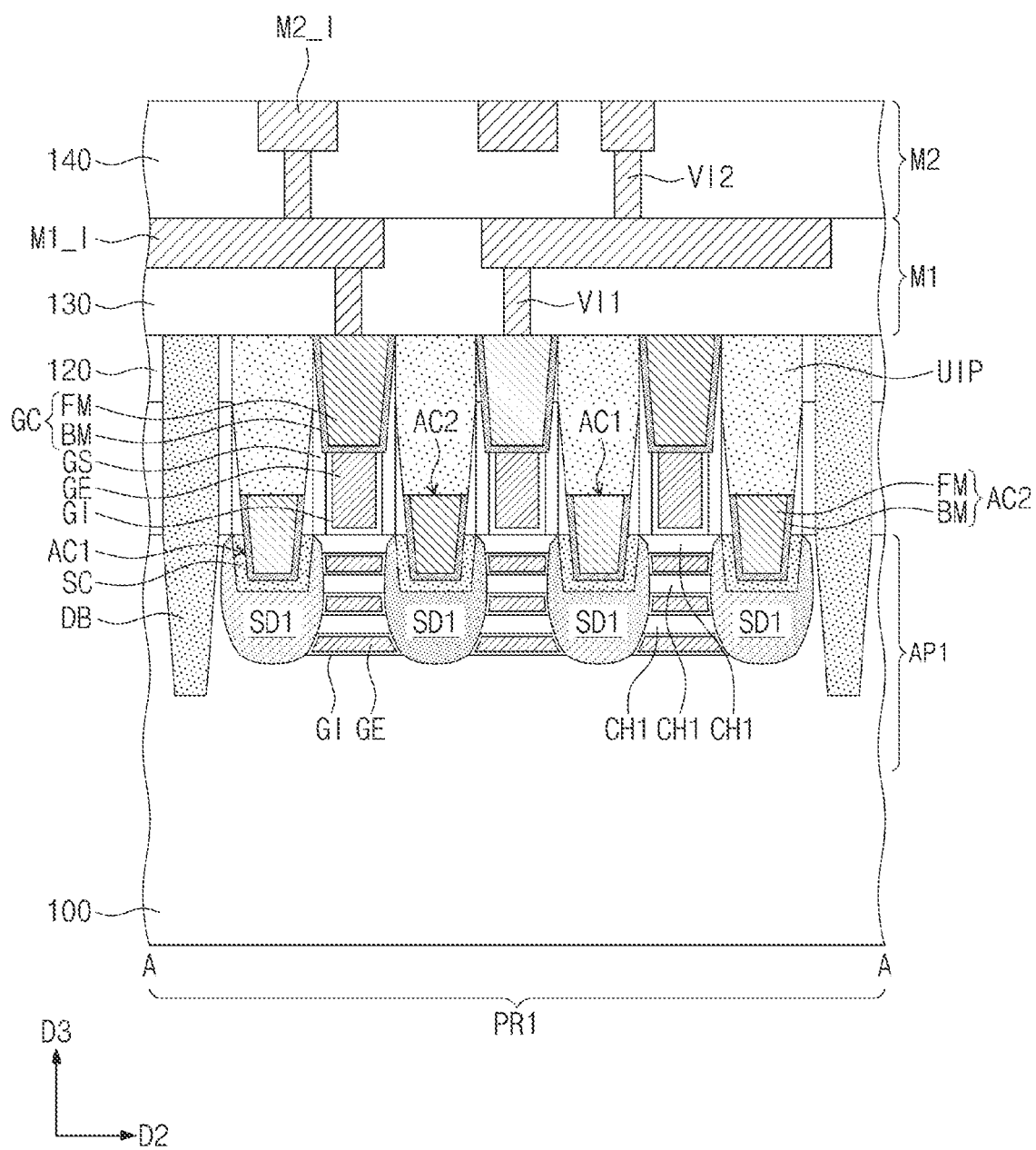
FIGS. 22A, 22B, 22C and 22D illustrate sectional views respectively taken along lines A-A', B-B', C-C', and E-E' of FIG. 4 of a semiconductor device according to embodiments of the inventive concepts.
Figure 22B:
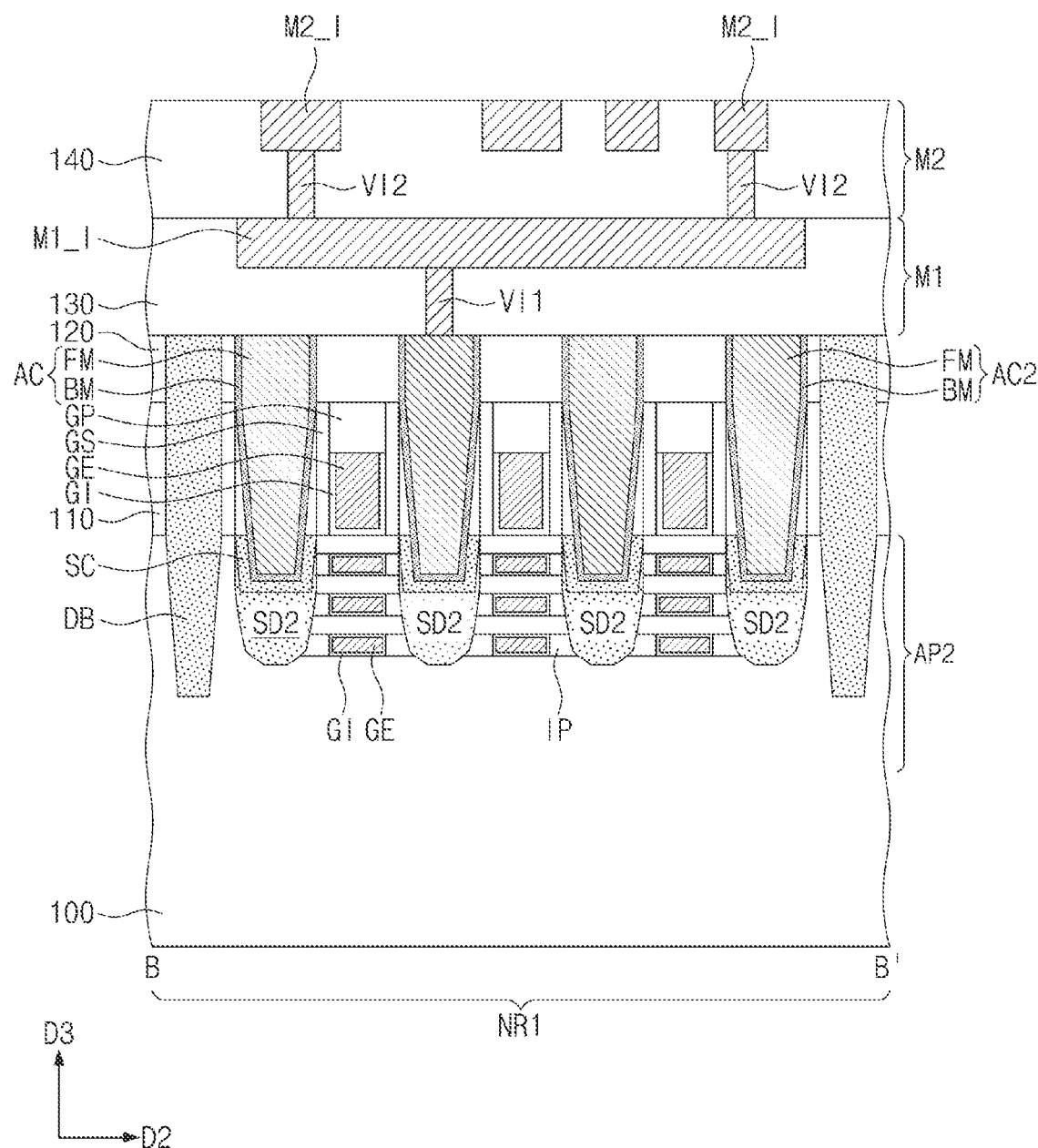
Figure 22C:
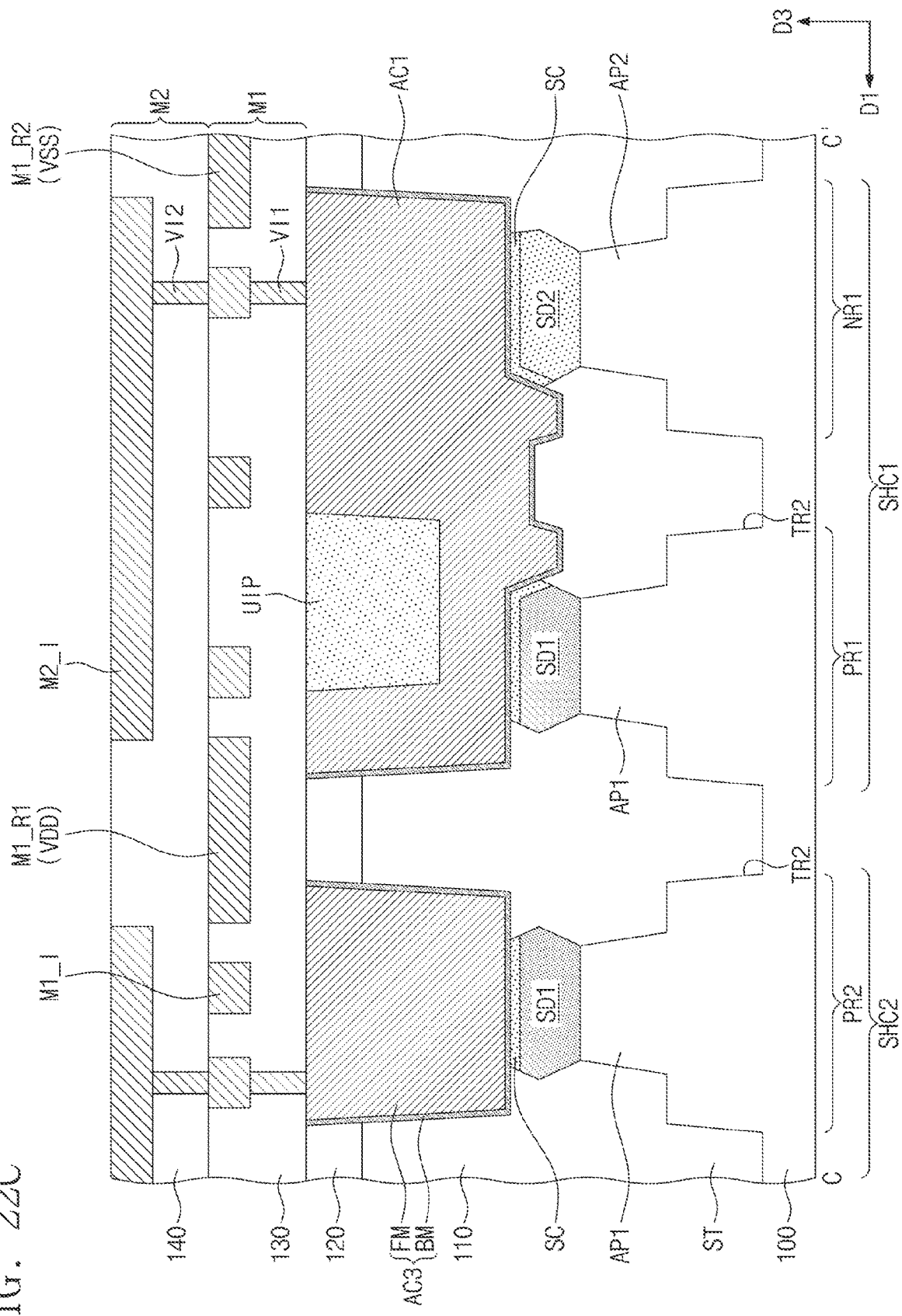
Figure 22D:
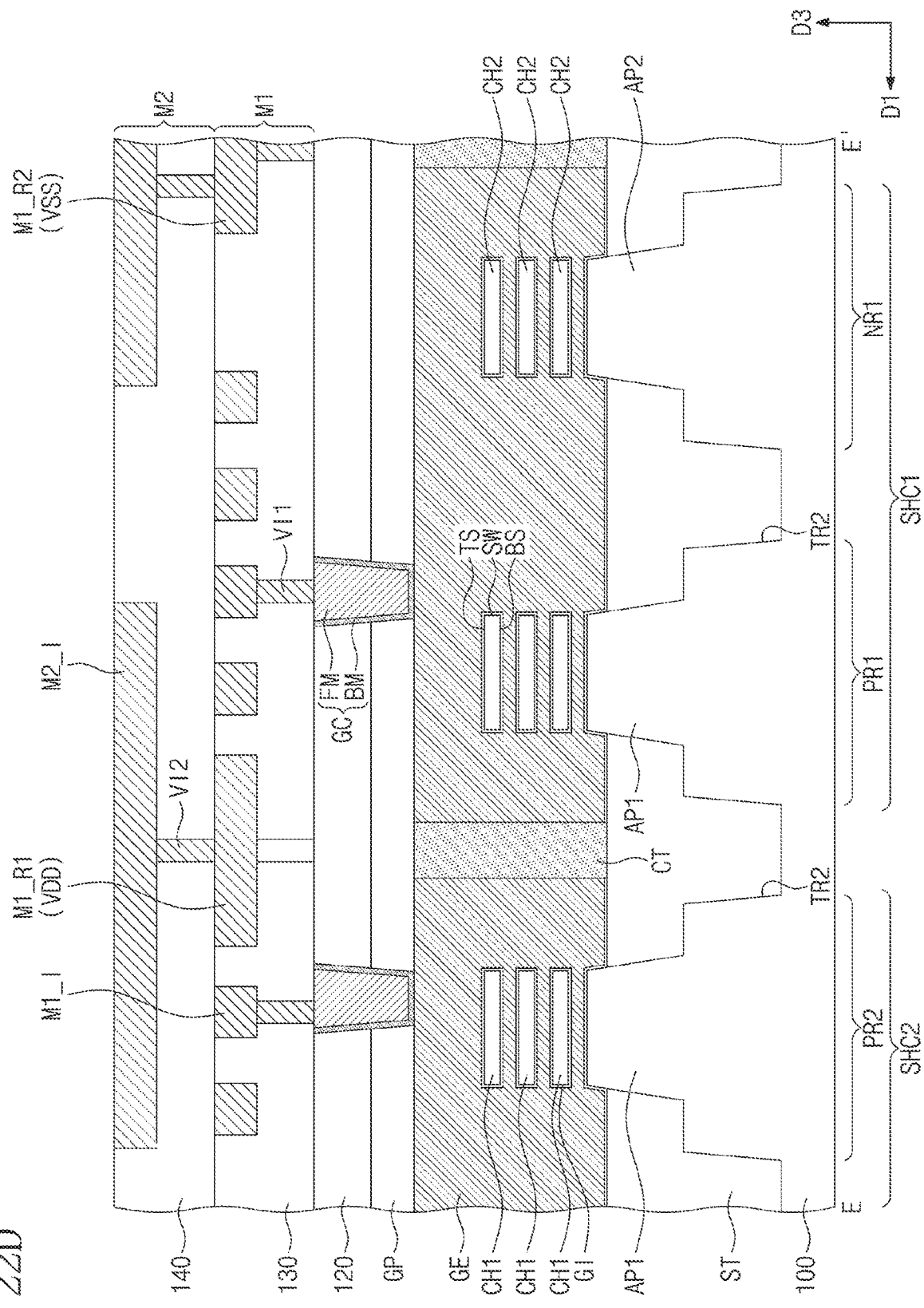

The gate electrode GE may be provided to surround each of the first and second channel patterns CH1 and CH2 (e.g., see FIG. 22D). The gate electrode GE may be provided on a top surface TS, at least one side surface SW, and a bottom surface BS of each of the first and second channel patterns CH1 and CH2. In other words, the gate electrode GE may be provided to face the top surface TS, the bottom surface BS, and the opposite side surfaces SW of each of the first and second channel patterns CH1 and CH2. A transistor according to the present embodiment may be a three-dimensional field-effect transistor (e.g., a multi-bridge channel field-effect transistor (MBCFET)), in which the gate electrode GE is provided to three-dimensionally surround the channel patterns CH1 and CH2.

The gate dielectric pattern GI may be provided between each of the first and second channel patterns CH1 and CH2 and the gate electrode GE. The gate dielectric pattern GI may be provided to surround each of the first and second channel patterns CH1 and CH2.

On the first and second NMOSFET regions NR1 and NR2, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. In contrast, on the first and second PMOSFET regions PR1 and PR2, the insulating pattern IP may be omitted.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. Gate contacts GC may be provided to penetrate the second interlayer insulating layer 120 and the gate capping pattern GP and to be respectively connected to the gate electrodes GE. The active contacts AC and gate contacts GC may be substantially the same as those in the previous embodiments described with reference to FIGS. 4 and 5A to 5E.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be substantially the same as those in the previous embodiments described with reference to FIGS. 4 and 5A to 5E.

In a semiconductor device according to embodiments of the inventive concepts, it may be possible to reduce both an electric resistance and a parasitic capacitance between an active contact and a source/drain pattern to thereby increase an operation speed of a device. In other words, a semiconductor device with improved electric characteristics may be provided.

While example embodiments of the inventive concepts have been particularly shown and described, it should be understood by one of ordinary skill in the art that variations in form and detail may be made therein without departing from the spirit and scope of the attached claims.

What is claimed is:

1. A semiconductor device, comprising:
a substrate having a PMOSFET region and an NMOSFET region spaced apart from each other in a first direction;
a device isolation layer on the substrate, the device isolation layer defines a first active pattern on the PMOSFET region and a second active pattern on the NMOSFET region;
a gate electrode extending in the first direction and crossing the first and second active patterns;
a first source/drain pattern and a second source/drain pattern respectively on the first and second active patterns, each of the first and second source/drain patterns being adjacent to a side of the gate electrode; and
a first active contact extending in the first direction and coupled to the first and second source/drain patterns,
wherein the first active contact comprises
a first body portion on the first source/drain pattern,
a second body portion on the second source/drain pattern, and
a first protruding portion and a recessed portion between the first and second body portions,
the first protruding portion and the recessed portion are over the device isolation layer between the PMOSFET and NMOSFET regions, and
the recessed portion of the first active contact has a bottom surface that is recessed in a second direction away from the device isolation layer.

2. The semiconductor device of claim 1, wherein the bottom surface of the recessed portion is higher than a bottom surface of the first protruding portion and is lower than a bottom surface of the first body portion.

3. The semiconductor device of claim 1, wherein the first protruding portion is between the first body portion and the recessed portion, and
the first active contact further comprises a second protruding portion between the recessed portion and the second body portion.

4. The semiconductor device of claim 3, wherein a level of a bottom surface of the first protruding portion is different from a level of a bottom surface of the second protruding portion, and
a largest width of the first protruding portion in the first direction is different from a largest width of the second protruding portion in the first direction.

5. The semiconductor device of claim 1, wherein a level of a bottom surface of the first body portion is lower than a level of a bottom surface of the second body portion.

6. The semiconductor device of claim 1, wherein the first protruding portion extends from the first body portion toward the device isolation layer along an inclined side surface of the first source/drain pattern.

7. The semiconductor device of claim 6, wherein the first body portion is electrically connected to a top surface of the first source/drain pattern, and
the first protruding portion is electrically connected to the inclined side surface of the first source/drain pattern.

8. The semiconductor device of claim 1, further comprising a gate contact on the PMOSFET region and coupled to the gate electrode,
wherein the first active contact further comprises an upper insulating pattern in an upper portion of the first body portion, and
the upper insulating pattern is adjacent to the gate contact.

9. The semiconductor device of claim 1, further comprising:
an interlayer insulating layer on the gate electrode;
a first metal layer on the interlayer insulating layer; and
a second metal layer over the first metal layer,
wherein the first active contact penetrates the interlayer insulating layer and is coupled to the first and second source/drain patterns,
the first metal layer comprises at least one first interconnection line that is electrically connected to the first active contact, and
the second metal layer comprises at least one second interconnection line that is electrically connected to the at least one first interconnection line.

10. The semiconductor device of claim 1, further comprising:
a third source/drain pattern provided on the first active pattern; and
a second active contact coupled to the third source/drain pattern,
wherein a length of the second active contact in the first direction is smaller than half of a length of the first active contact in the first direction.

11. A semiconductor device, comprising: a first logic cell and a second logic cell on a substrate and adjacent to each other in a first direction, and each of the first and second logic cells has a first active region and a second active region, the first active region being one of a PMOSFET region and an NMOSFET region, and the second active region being another one of the PMOSFET region and the NMOSFET region; and an active contact extending from the first active region of the first logic cell to the first active region of the second logic cell, wherein the active contact comprises a first body portion on the first active region of the first logic cell, a second body portion on the first active region of the second logic cell, and a first protruding portion and a recessed portion between the first and second body portions, the first protruding portion and the recessed portion are over a device isolation layer between the first active region of the first logic cell and the first active region of the second logic cell, the recessed portion of the active contact has a bottom surface that is recessed in a second direction away from the device isolation layer, and the bottom surface of the recessed portion is higher than a bottom surface of the first protruding portion and is lower than a bottom surface of the first body portion.

12. The semiconductor device of claim 11, further comprising a first metal layer over the active contact,
wherein the first metal layer comprises a first power line electrically connected to the active contact, and
the first power line extends along a border between the first and second logic cells and in a second direction crossing the first direction.

13. The semiconductor device of claim 11, wherein the first protruding portion is between the first body portion and the recessed portion, and
the active contact further comprises a second protruding portion between the recessed portion and the second body portion.

14. The semiconductor device of claim 13, wherein a level of the bottom surface of the first protruding portion is different from a level of a bottom surface of the second protruding portion, and
a largest width of the first protruding portion in the first direction is different from a largest width of the second protruding portion in the first direction.

15. The semiconductor device of claim 13, wherein the first logic cell comprises a source/drain pattern on the first active region,
the first body portion is electrically connected to a top surface of the source/drain pattern,
the first protruding portion extends from the first body portion toward the device isolation layer along an inclined side surface of the source/drain pattern, and
the first protruding portion is electrically connected to the inclined side surface of the source/drain pattern.

16. A semiconductor device, comprising:
a logic cell on a substrate, the logic cell having a PMOSFET region and an NMOSFET region separated from each other in a first direction, the logic cell having first to fourth borders, the first border and the second border being opposite to each other in a second direction crossing the first direction, the third border and the fourth border being opposite to each other in the first direction;
a device isolation layer on the substrate, the device isolation layer defines a first active pattern on the PMOSFET region and a second active pattern on the NMOSFET region, the first and second active patterns extending in the second direction, upper portions of the first and second active patterns protruding above the device isolation layer;
a gate electrode extending in the first direction and crossing the first and second active patterns;
a first source/drain pattern and a second source/drain pattern respectively in the upper portions of the first and second active patterns, and each of the first and second source/drain patterns adjacent to a side of the gate electrode;
a separation structure on at least one of the first and second borders;
a gate spacer on at least one side surface of the gate electrode;
a gate capping pattern on a top surface of the gate electrode;
an interlayer insulating layer on the gate capping pattern;
an active contact that penetrates the interlayer insulating layer and is coupled to the first and second source/drain patterns;
a silicide pattern interposed between the active contact and each of the first and second source/drain patterns;
a gate contact that penetrates the interlayer insulating layer and the gate capping pattern and is coupled to the gate electrode;
a first metal layer on the interlayer insulating layer, the first metal layer comprising first and second power lines respectively on the third and fourth borders and extending in the second direction, and first interconnection lines between the first and second power lines, the first interconnection lines being respectively and electrically connected to the active contact and the gate contact; and
a second metal layer over the first metal layer,
wherein the second metal layer comprises second interconnection lines extending in the first direction and electrically connected to the first metal layer,
the active contact comprises
a first body portion on the first source/drain pattern,
a second body portion on the second source/drain pattern, and
a first protruding portion and a recessed portion between the first and second body portions,
the first protruding portion and the recessed portion are over the device isolation layer between the PMOSFET and NMOSFET regions, and
the recessed portion of the active contact has a bottom surface recessed in a third direction away from the device isolation layer.

17. The semiconductor device of claim 16, wherein the bottom surface of the recessed portion is higher than a bottom surface of the first protruding portion and is lower than a bottom surface of the first body portion.

18. The semiconductor device of claim 16, wherein the first protruding portion is between the first body portion and the recessed portion, and
the active contact further comprises a second protruding portion between the recessed portion and the second body portion.

19. The semiconductor device of claim 18, wherein a level of a bottom surface of the first protruding portion is different from a level of a bottom surface of the second protruding portion, and
a largest width of the first protruding portion in the first direction is different from a largest width of the second protruding portion in the first direction.

20. The semiconductor device of claim 16, wherein a level of a bottom surface of the first body portion is lower than a level of a bottom surface of the second body portion.

* * * * *